United States Patent
Fu et al.

(10) Patent No.: US 12,120,924 B2
(45) Date of Patent: *Oct. 15, 2024

(54) DISPLAY PANEL AND DISPLAY DEVICE INCLUDING TRANSPARENT REGIONS WITH DIFFERENT THICKNESSES

(71) Applicant: Shanghai Tianma Micro-Electronics Co., Ltd., Shanghai (CN)

(72) Inventors: Jujian Fu, Shanghai (CN); Shaorong Yu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 379 days.

This patent is subject to a terminal disclaimer.

(21) Appl. No.: 17/535,593

(22) Filed: Nov. 25, 2021

(65) Prior Publication Data

US 2022/0085122 A1 Mar. 17, 2022

Related U.S. Application Data

(63) Continuation-in-part of application No. 16/853,707, filed on Apr. 20, 2020, now Pat. No. 11,205,687.

(30) Foreign Application Priority Data

Dec. 3, 2019 (CN) .......................... 201911223241.1

(51) Int. Cl.
- H01L 27/32 (2006.01)
- H01L 25/16 (2023.01)
- H10K 59/00 (2023.01)
- H10K 59/122 (2023.01)

(52) U.S. Cl.
CPC .................. *H10K 59/122* (2023.02)

(58) Field of Classification Search
CPC .. H10K 59/122; H10K 59/123; H10K 59/875; H10K 59/131; H10K 59/876; H10K 59/8731
USPC ........................................ 257/40; 438/82, 99
See application file for complete search history.

(56) References Cited

U.S. PATENT DOCUMENTS

| | | | |
|---|---|---|---|
| 11,205,687 B2* | 12/2021 | Fu | H10K 59/10 |
| 2014/0071657 A1* | 3/2014 | Sekiguchi | G02F 1/13336 |
| | | | 362/97.1 |

FOREIGN PATENT DOCUMENTS

CN 204651324 U 9/2015

* cited by examiner

*Primary Examiner* — Didarul A Mazumder
(74) *Attorney, Agent, or Firm* — KILPATRICK TOWNSEND & STOCKTON LLP

(57) ABSTRACT

Provided are a display panel and a display device. The display panel includes a display area, the display area includes transparent display regions, where film layers in at least two display regions of transparent display regions have different thicknesses, and/or the film layers in the at least two adjacent transparent regions are made of different materials.

18 Claims, 24 Drawing Sheets

DISPLAY PANEL AND DISPLAY DEVICE INCLUDING TRANSPARENT REGIONS WITH DIFFERENT THICKNESSES

CROSS-REFERENCES TO RELATED APPLICATIONS

This application is a continuation-in-part application of U.S. patent application Ser. No. 16/853,707, filed Apr. 20, 2020, which claims the priority to a Chinese patent application No. CN201911223241.1 filed at the CNIPA on Dec. 3, 2019, disclosures of which are incorporated herein by references in their entireties.

FIELD

The present disclosure relates to the field of display techniques and, in particular, to a display panel and a display device.

BACKGROUND

With the development of display technology, various products such as full-screen display device and transparent display device are gradually appeared to meet the diverse display requirements of users. In the full-screen display device, in order to meet the requirements of high screen-to-body ratio and front camera configuration, transparent regions are generally configured in the display area of the display screen. In addition, since the transparent display device allows users to view a scene from the back of the display screen, transparent regions are also configured in the transparent display device.

The transparent regions allow the light beams outgoing from the one side of the display panel to transmit to the other side of the display panel through the transparent region.

SUMMARY

One embodiment of the present disclosure provides a display panel. The display panel includes a display area, where the display area includes a plurality of transparent regions. Film layers in at least two transparent regions in transparent regions have different thicknesses, and/or the film layers in the at least two transparent regions in transparent regions are made of different materials.

Another embodiment of the present disclosure provides a display panel. The display panel includes a display area, where the display area includes a plurality of transparent regions, and the transparent region includes a plurality of transparent sub-regions. Film layers in each transparent sub-region in the transparent region have different thicknesses, and/or the film layers in each transparent sub-region in the transparent region are made of different materials.

Another embodiment of the present disclosure provides a display device, and the display device includes a display panel. The display panel includes a display area, where the display area includes a plurality of transparent regions. Film layers in at least two transparent regions in transparent regions have different thicknesses, and/or the film layers in the at least two transparent regions in transparent regions are made of different materials.

DETAILED DESCRIPTION

Figure 1:
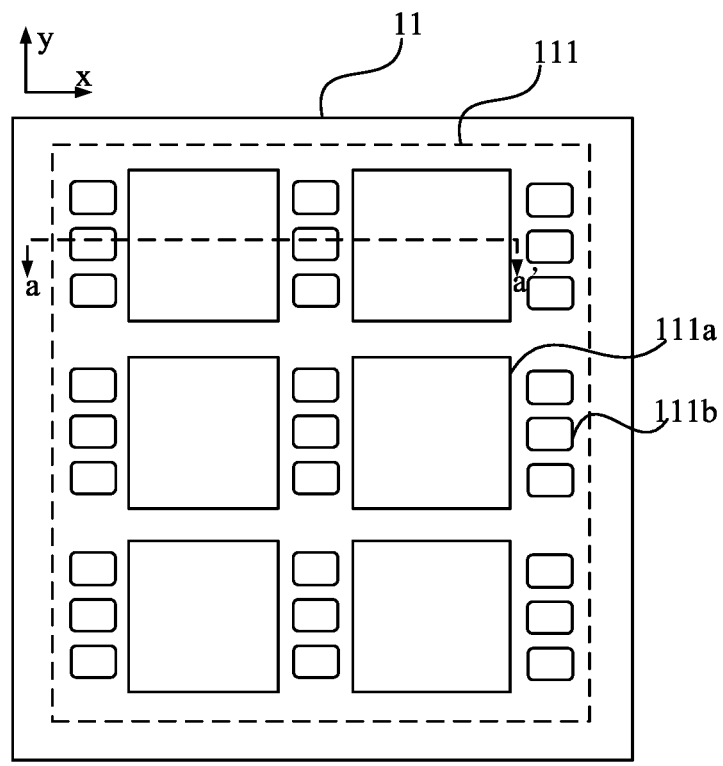
FIG. 1 is a structural diagram of a display panel according to an embodiment of the present disclosure.

Hereinafter the present disclosure will be further described in detail in conjunction with the drawings and embodiments. It is to be understood that the embodiments set forth below are intended to illustrate and not to limit the present disclosure. Additionally, it is to be noted that, for ease of description, only part, not all, of the structures related to the present disclosure are illustrated in the drawings.

Figure 2:
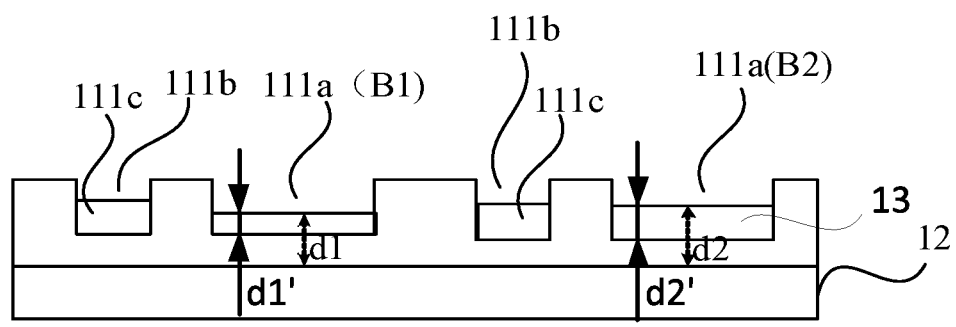
FIG. 2 is a sectional view of the display panel taken along a section line a-a' of FIG. 1.

FIG. 1 is a structural diagram of a display panel according to an embodiment of the present disclosure, and FIG. 2 is a sectional view of the display panel taken along section line a-a' of FIG. 1. As shown in FIG. 1, a display area 11 of the display panel includes a transparent display region 111, where the transparent display region 111 includes multiple transparent regions 111a arranged in an array and the multiple transparent regions 111a allow a user to view objects or images on a non-emissive side of the display panel. Moreover, the transparent display region 111 includes multiple light-emitting regions 111b disposed in regions between adjacent transparent regions 111a, so that the display panel can display images. Thus, the user can see objects or images in a viewing angle obstructed by the display panel when viewing images of the display panel, a transparent display panel is implemented and the user experience is improved. Referring to FIG. 2, along a direction perpendicular to the display panel, the display panel includes a substrate 12 and multiple first light-emitting elements 111c disposed on one side of the substrate 12 and in the multiple light-emitting regions 111b. Exemplarily, as shown in FIG. 2, the multiple light-emitting regions 111b are disposed in one-to-one correspondence with the multiple first light-emitting elements 111c. This example may include first light-emitting elements 111c of different colors, and similarly, the first light-emitting elements 111c may be arranged in an array in the transparent display region 111, so that images can be displayed through the first light-emitting elements 111c of different colors. In the transparent display region 111, at least two adjacent transparent regions 111a have different film thicknesses. It is to be noted that film layers of a light-transmitting region 111a mentioned here may refer to all film layers in the light-transmitting region 111a, or may refer to specific film layers in the light-transmitting region 111a. Exemplarily, for light-transmitting region B1 and light-transmitting region B2 disposed adjacent to each other, film thickness d1 of light-transmitting region B1 located on the substrate 12 is different from film thickness d2 of light-transmitting region B2 located on the substrate 12. This results in different optical paths and phase differences when external light passes through adjacent transparent regions, and reduces the diffraction of the external light that passes through the adjacent transparent regions, ensuring the effect of light-transmitting display and avoiding the display distortion of the display panel. From the light diffraction formula, when an optical path difference is an integral multiple of a wavelength, light is diffracted and forms dark fringes, and when the optical path difference is an integral multiple of half of the wavelength, light is diffracted and forms bright fringes. In this embodiment, the optical path of light incident on the multiple transparent regions is adjusted through an adjustment of a film thickness, so that the optical path difference of light between the adjacent transparent regions is not in the state of the bright fringes or the dark fringes, and this reduces the diffraction of the external light that passes through the multiple transparent regions. Similarly, to reduce the diffraction of the external light that passes through the multiple transparent regions, it is feasible to configure the at least two adjacent transparent regions 111a to have different film materials to change the optical path of the external light and reduce the diffraction. Alternatively, it is feasible to control the at least two adjacent transparent regions 111a to have different film thicknesses and different film materials to further prevent the diffraction.

Still referring to FIG. 2, the display panel may further include a first organic layer 13 located on one side of the substrate 12 facing to the multiple first light-emitting elements 111c. The first organic layer 13 is disposed at least in the transparent display region and has different thicknesses in at least two adjacent transparent regions. Exemplarily, as shown in FIG. 2, the first organic layer 13 has different thicknesses in two adjacent transparent regions 111a, where the first organic layer 13 has thickness d1' in light-transmitting region B1 and thickness d2' in light-transmitting region B2. The first organic layer 13 is disposed on one side of the substrate 12 facing to the multiple first light-emitting elements 111c and may cover the transparent display region. In one embodiment, the first organic layer 13 may be further disposed in other regions in addition to the transparent display region, which is not limited in this embodiment. Moreover, compared with an inorganic layer, the organic layer has a greater film thickness and is difficult to crack, and it is easy to dispose film layers of different thicknesses. The first organic layer 13 has different thicknesses in the at least two adjacent transparent regions and avoids the diffraction between adjacent transparent regions 111a of different thicknesses, reducing the diffraction in the whole transparent display region. In one embodiment, the preceding first organic layer 13 may refer to the substrate 12 and/or all organic film layers on one side of the substrate 12 facing to the multiple first light-emitting elements 111c, or may refer to at least one organic film on one side of the substrate 12 facing to the multiple first light-emitting elements 111c. The number of film layers in the first organic layer 13 is not limited in this embodiment.

In one embodiment, the first organic layer 13 may have random thicknesses in the multiple transparent regions 111a. Then, there is no regularity between the thicknesses in the multiple transparent regions 111a, and it is ensured that the first organic layer 13 has different thicknesses in any two adjacent transparent regions 111a. Therefore, external light are rarely diffracted in the multiple transparent regions 111a where the first organic layer 13 has random thicknesses, and the diffraction can be almost avoided for the display panel with the first organic layer 13 having random thicknesses in the multiple transparent regions 111a. This is an effective disposing of the first organic layer 13. It is to be noted that the "random" mentioned here can be understood as "be without no specific regularity". In an example in this embodiment, the first organic layer 13 has a different thickness in each light-transmitting region 111a, avoiding the diffraction completely and improving the display effect of the display panel.

In one embodiment, in the multiple transparent regions, the first organic layer may have thicknesses repeatedly configured according to a first variation period along a row direction and/or a column direction, where the first variation period includes n thickness values. The n thickness values increase progressively in the first variation period, where n denotes a positive integer and n≥3.

Figure 3:
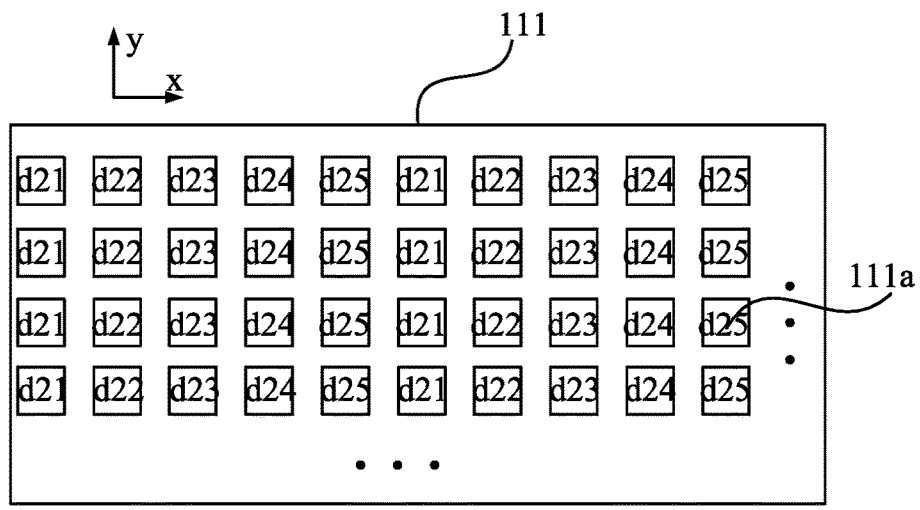
FIG. 3 is a structural diagram of multiple transparent regions arranged in an array according to an embodiment of the present disclosure.
Figure 4:
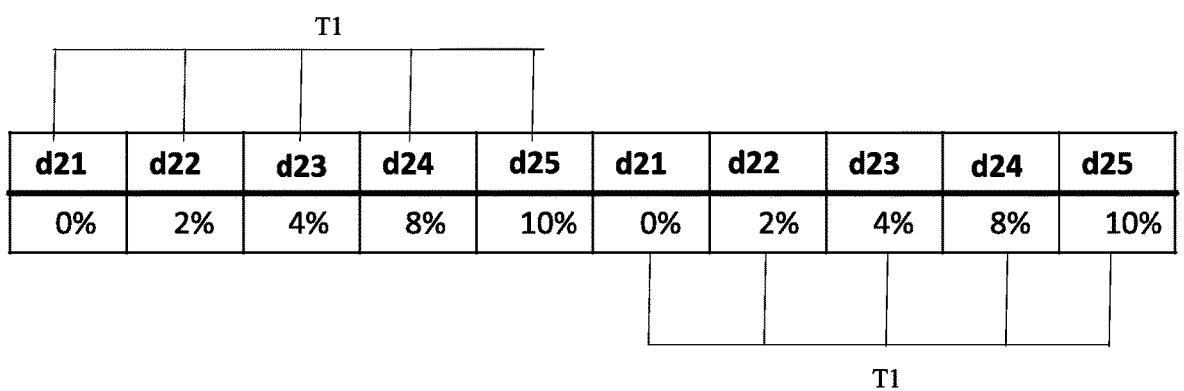
FIG. 4 is a schematic diagram showing a configured period of thicknesses of a first organic layer in transparent regions according to an embodiment of the present disclosure.

FIG. 3 is a structural diagram of multiple transparent regions arranged in an array according to an embodiment of the present disclosure. As shown in FIG. 3, the multiple transparent regions 111a are arranged in an array in the transparent display region 111. In one embodiment, the multiple transparent regions 111a are sequentially arranged along the row direction x and sequentially arranged along the y direction. In this embodiment, the first organic layer 13 may be controlled to have thicknesses repeatedly configured according to a variation period in the multiple transparent regions 111a that are sequentially arranged along the row direction x. This can prevent the first organic layer 13 from having the same thickness in two adjacent transparent regions 111a to avoid the diffraction of the external light, and also helps dispose the first organic layer 13 in different transparent regions 111a according to a regularity and simplify a disposing process of the first organic layer 13. Similarly, the first organic layer 13 may be controlled to have thicknesses repeatedly configured according to a variation period in the multiple transparent regions 111a that are sequentially arranged along the column direction y. Additionally, the first organic layer 13 may be controlled to have thicknesses repeatedly configured according to a variation period in the multiple transparent regions 111a that are sequentially arranged along both the row direction x and the column direction y to further reduce the diffraction of the multiple transparent regions 111a. In one embodiment, in the multiple transparent regions 111a, the first organic layer 13 may have thicknesses repeatedly configured according to the first variation period along the row direction x and/or the column direction y, where the first variation period includes n thickness values. Then, along the row direction x and/or the column direction y, there are adjacent n transparent regions 111a in one-to-one correspondence with the n thickness values, and the first organic layer 13 in a next light-transmitting region 111a has the same thickness as the first organic layer 13 in the first light-transmitting region 111a of the preceding n transparent regions 111a. After that, this cycle is repeated until the thickness of the first organic layer 13 in the last light-transmitting region 111a of the row or column is configured. n may be an integer greater than or equal to 3 and has a value set according to the actual situation, as long as the first organic layer 13 is prevented from having the same thickness in transparent regions 111a facing to each other and results in the diffraction problem, avoiding the diffraction of the light regions 111a. The n thickness values increase progressively in the first variation period, helping configure the thicknesses of the first organic layer 13. FIG. 4 is a schematic diagram showing a configured period of thicknesses of a first organic layer in transparent regions according to an embodiment of the present disclosure. Exemplarily, as shown in FIG. 4, n=5, and in first variation period T1, thickness values of the first organic layer 13 in the multiple transparent regions 111a may be set sequentially as follows: $d21=d+d*0\%$, $d22=d+d*2\%$, $d23=d+d*4\%$, $d24=d+d*8\%$ and $d25=d+d*10\%$, where d denotes a preset initial thickness. Then, among the transparent regions 111a arranged along the row direction x, the first organic layer 13 has thickness d21 in the first light-transmitting region 111a, thickness d22 in the second light-transmitting region 111a, thickness d23 in the third light-transmitting region 111a, thickness d24 in the fourth light-transmitting region 111a, thickness d25 in the fifth light-transmitting region 111a, and thickness of d26 in the sixth light-transmitting region 111a. The cycle is repeated in this way so that the first organic layer 13 has different thicknesses in two adjacent transparent regions 111a along the row direction x, solving the diffraction problem.

In one embodiment, the n thickness values may be an arithmetic progression in the first variation period to help configure the thicknesses of the first organic layer 13 in different transparent regions 111a regularly and accurately, avoiding configuring a wrong thickness. The common difference value of the arithmetic progression may be selected according to implementation. In one embodiment, the n thickness values may be a geometric progression so that the first organic layer 13 has a greater thickness difference between two adjacent transparent regions 111a, which is not limited in this embodiment.

In one embodiment, in the multiple transparent regions, the first organic layer may have thicknesses repeatedly configured according to a second variation period along the row direction and/or the column direction. The second variation period includes a first sub-variation period and a second sub-variation period, and thickness values in the first sub-variation period are alternated with thickness values in the second sub-variation period in the second variation period. The first sub-variation period includes m1 thickness values, where the m1 thickness values increase progressively in the first sub-variation period; and the second sub-variation period includes m2 thickness values, where the m2 thickness values decrease progressively in the second sub-variation period. m1 and m2 denote positive integers, m1≥3 and m2≥3.

Figure 5:
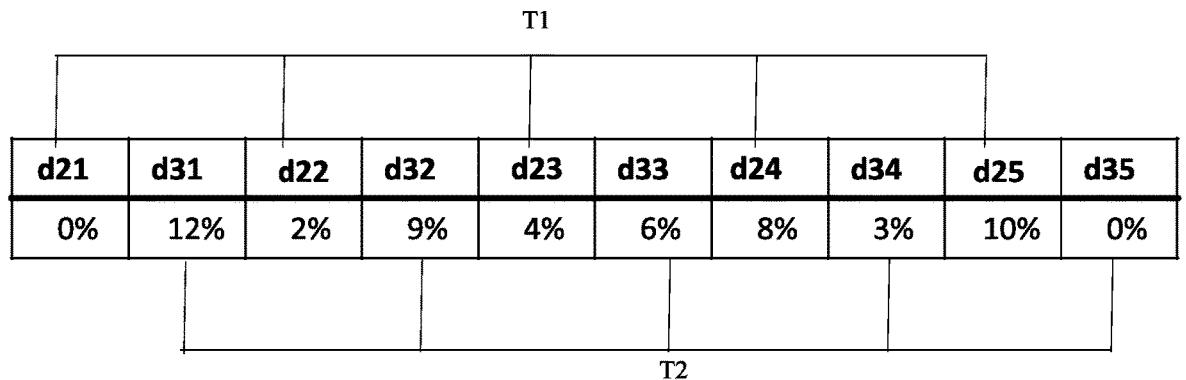
FIG. 5 is a schematic diagram showing another configured period of thicknesses of a first organic layer in transparent regions according to an embodiment of the present disclosure.

In the multiple transparent regions, the first organic layer may have thicknesses repeatedly configured according to the second variation period along the row direction x and/or the column direction y. FIG. 5 is a schematic diagram of another configured period of thicknesses of a first organic layer in transparent regions according to an embodiment of the present disclosure. As shown in FIG. 5, the second variation period may include first sub-variation period T1 and second sub-variation period T2, and thickness values in first sub-variation period T1 are alternated with thickness values in second sub-variation period T2 in the second variation period. First sub-variation period T1 includes m1 thickness values and second sub-variation period T2 includes m2 thickness values, and thus, the second variation period includes (m1+m2) thickness values and thickness values of the first organic layer in (m1+m2) adjacent transparent regions are configured in one-to-one correspondence with the (m1+m2) thickness values. Moreover, the m1 thickness values increase progressively in first sub-variation period T1 and the m2 thickness values decrease progressively in second sub-variation period T2, and thus the thickness values of the first organic layer in the (m1+m2) adjacent transparent regions first increase sequentially and then decrease gradually so that the disposing complexity of the first organic layer in the multiple transparent regions is increased and the diffraction is reduced. Exemplarily, as shown in FIG. 5, m1 and m2 each has a value of 5. In first sub-variation period T1, the m1 thickness values are set sequentially as follows: $d21=d+d*0\%$, $d22=d+d*2\%$, $d23=d+d*4\%$, $d24=d+d*8\%$ and $d25=d+d*10\%$; and in second sub-variation period T2, the m2 thickness values are set sequentially as follows: $d31=d+d*12\%$, $d32=d+d*9\%$, $d33=d+d*6\%$, $d34=d+d*3\%$ and $d35=d+d*0\%$, where d denotes a preset initial thickness. Thus, in the second variation period, thickness values of the first organic layer in the (m1+m2) adjacent transparent regions are sequentially d21, d22, d23, d24, d25, d31, d32, d33, d34 and d35, and this cycle is configured according to the second variation period.

In the preceding solution, first sub-variation period T1 and second sub-variation period T2 are sequentially configured in the second variation period. Continuing to refer to FIG. 5, In one embodiment, first sub-variation period T1 and second sub-variation T2 may be simultaneously configured. That is, along the row direction or the column direction, one thickness value in first sub-variation period T1 may be selected as the thickness of the first organic layer in the i-th light-transmitting region, and one thickness value in second sub-change period T2 may be selected as the thickness of the first organic layer in the (i+1)-th light-transmitting region. Exemplarily, in the second variation period, thickness values of the first organic layer in the (m1+m2) adjacent transparent regions are sequentially d21, d31, d22, d32, d23, d33, d24 d34, d25 and d35, and this cycle is configured according to the second variation period. If the m1 thickness values increase progressively but the m2 thickness values decrease progressively, then the first organic layer has a greater thickness difference between two adjacent transparent regions. For example, when the first organic layer has thicknesses d21 and d31 in adjacent transparent regions, where d21=d+d*0% and d31=d+d*12%, the first organic layer has a thickness difference up to d*12% that can effectively prevent the diffraction.

In one embodiment, in the multiple transparent regions arranged in an array, the first organic layer may have thicknesses repeatedly configured according to the first variation period in the j-th row of the multiple transparent regions, and have thicknesses repeatedly configured according to the second variation period in the (j+1)-th row of the multiple transparent regions. Alternatively, the first organic layer may have the thicknesses repeatedly configured according to the first variation period in the j-th column of the multiple transparent regions, and have the thicknesses repeatedly configured according to the second variation period in the (j+1)-th column of the multiple transparent regions. This increases the complexity of the thickness configuration of the first organic layer in the multiple transparent regions and reduces the diffraction.

In one embodiment, the m1 thickness values may be an arithmetic progression in first sub-variation period T1, and the m2 thickness values may be an arithmetic progression in second sub-variation period T2, where the arithmetic progression in first sub-variation period T1 has a different common difference than the arithmetic progression in second sub-variation period T2. It is easier to configure data of an arithmetic progression regularly and accurately, helping improve the accuracy of the thickness configuration of the first organic layer. Moreover, the arithmetic progression in first sub-variation period T1 has a different common difference than the arithmetic progression in second sub-variation period T2, so it is not easy for the thickness values in first sub-variation period T1 to be the same as the thickness values in second sub-variation period T2, further reducing the diffraction of the multiple transparent regions.

Figure 6:
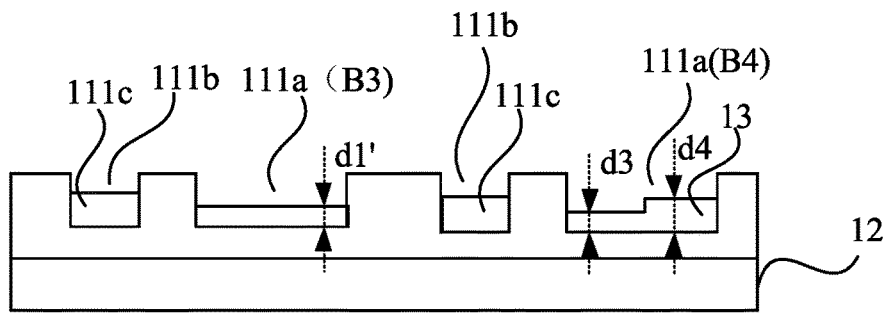
FIG. 6 is another sectional view of the display panel taken along a section line a-a' of FIG. 1.

FIG. 6 is another sectional view of the display panel taken along section line a-a' of FIG. 1. In one embodiment, referring to FIG. 6, the first organic layer 13 may have at least two different thicknesses in each light-transmitting region 111a. In the display panel shown in FIG. 2, the first organic layer 13 has different thicknesses in two adjacent transparent regions 111a, but has a constant thickness in the same light-transmitting region 111a. In contrast, in the example of FIG. 6, the first organic layer 13 may have the at least two different thicknesses in each light-transmitting region 111a. For example, the first organic layer 13 has thickness d1' in light-transmitting region B3, but has thicknesses d3 and d4 in light-transmitting region B4. It is feasible to control the optical path difference in the same light-transmitting region 111a to further reduce the diffraction of the multiple transparent regions.

Figure 7:
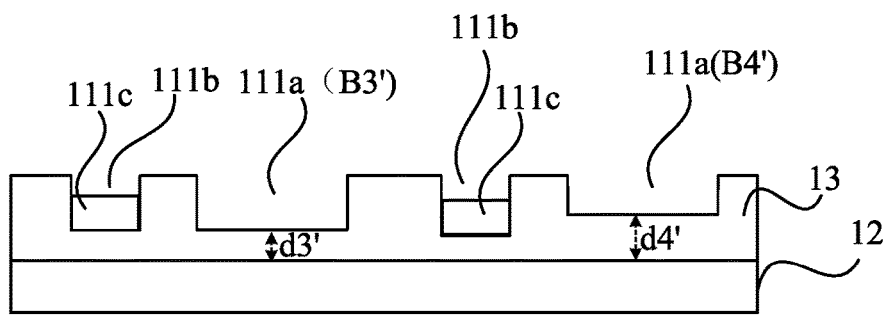
FIG. 7 is another sectional view of the display panel taken along a section line a-a' of FIG. 1.

FIG. 7 is another sectional view of the display panel taken along section line a-a' of FIG. 1. In one embodiment, referring to FIG. 7, the first organic layer 13 may include multiple grooves disposed in the multiple transparent regions 111a, and the first organic layer 13 has different thicknesses in at least two adjacent grooves.

The first organic layer 13 in the multiple transparent regions 111a may be formed by at least one layer of organic material that are stacked together or a planar organic material recessed. As shown in FIG. 7, when the first organic layer 13 is formed from the planar organic material recessed, the grooves are disposed in one-to-one correspondence with the multiple transparent regions 111a, the grooves are disposed in the multiple transparent regions 111a, and the first organic layer 13 has different thicknesses in adjacent grooves, that is, adjacent transparent regions 111a. As shown in FIG. 7, the first organic layer 13 has thickness d3' in light-transmitting region B3', and thickness d4' in light-transmitting region B4; the first organic layer 13 has different thicknesses in adjacent grooves.

In one embodiment, the first organic layer 13 may be formed by using a half-tone mask, so that the regions, corresponding to the multiple transparent regions 111a, of the first organic layer 13 are directly masked to form the preceding grooves. The first organic layer 13 may also be formed in a coating manner, and the grooves may be formed in an etching or laser drilling manner. The forming process of the grooves is not limited in this embodiment.

Figure 8:
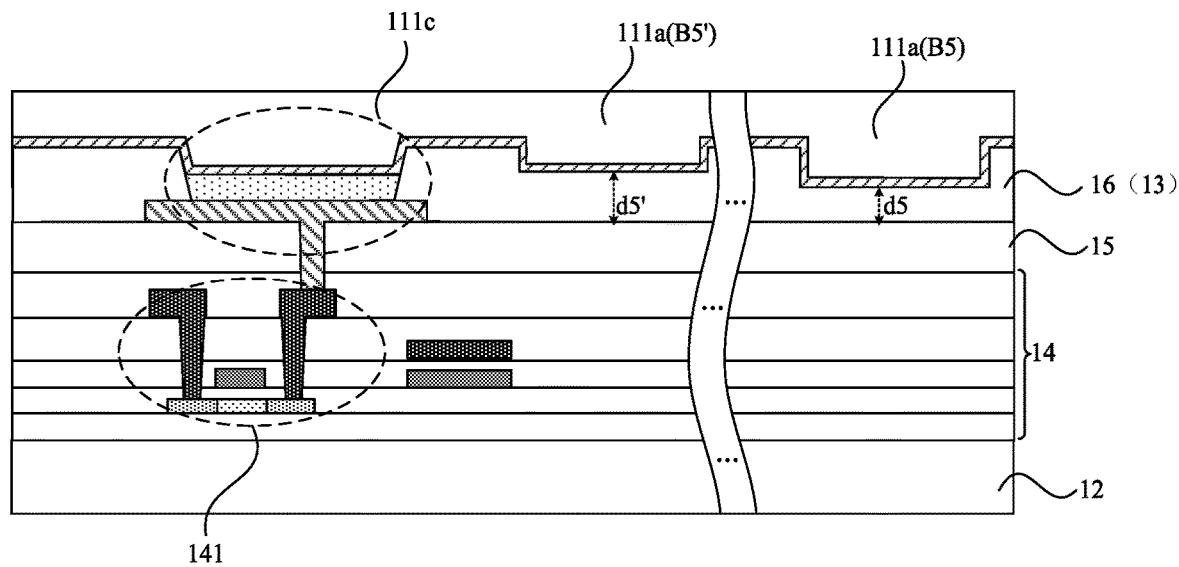
FIG. 8 is a partial sectional view of a display panel according to an embodiment of the present disclosure.

FIG. 8 is a sectional view of a display panel according to an embodiment of the present disclosure. In one embodiment, referring to FIG. 8, the display panel may further include a driving circuit layer 14, a planarization layer 15 and a pixel definition layer 16. The driving circuit layer 14 is disposed on one side of the substrate 12 facing to the multiple first light-emitting elements 111c. The planarization layer 15 is disposed on one side of the driving circuit layer 14 facing away from the substrate 12. The pixel definition layer 16 is disposed on one side of the planarization layer 15 facing away from the driving circuit layer 14 and is provided with multiple openings, where the multiple first light-emitting elements 111c are disposed in the multiple openings. The first organic layer 13 is the planarization layer 15 and/or the pixel definition layer 16.

Figure 9:
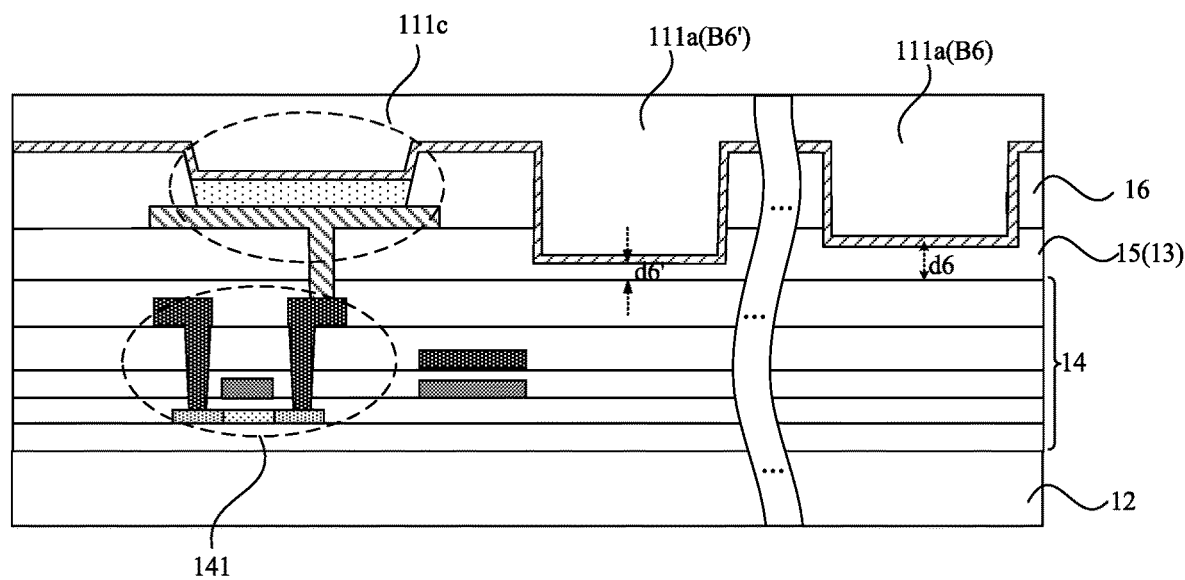
FIG. 9 is a partial sectional view of another display panel according to an embodiment of the present disclosure.

The driving circuit layer 14 is disposed between the substrate 12 and the multiple first light-emitting elements 111c and includes first driving circuits 141 arranged in an array. The first driving circuits 141 are disposed in one-to-one correspondence with the multiple first light-emitting elements 111c and configured to drive the corresponding first light-emitting elements 111c to emit light. The planarization layer 15 and the pixel definition layer 16 are further sequentially disposed between the driving circuit layer 14 and the multiple first light-emitting elements 111c. The planarization layer 15 planarizes the surface, on one side close to the multiple first light-emitting elements 111c, of the driving circuit layer 14. The pixel definition layer 16 is disposed between the driving circuit layer 14 and the multiple first light-emitting elements 111c and includes the multiple openings, where the multiple first light-emitting elements 111c are disposed in the multiple openings. The first organic layer 13 in the transparent display region may be the planarization layer 15 and/or the pixel definition layer 16. As shown in FIG. 8, the first organic layer 13 in the transparent display region is the pixel definition layer 16, and the first organic layer 13, that is, the pixel definition layer 16, has different thicknesses in different transparent regions 111a. Exemplarily, the first organic layer 13 has thickness d5 in light-transmitting region B5 and thickness d5' in adjacent light-transmitting region B5', where d5 has a different value than d5'. Then, the pixel definition layer 16 in the multiple transparent regions 111a may have different thicknesses than other parts of the transparent display region. The first organic layer 13 in the transparent display region may be the planarization layer 15. FIG. 9 is a sectional view of another display panel according to an embodiment of the present disclosure. As shown in FIG. 9, in the multiple transparent regions 111a, vias are formed in the pixel definition layer 16 and leaves exposed planarization layer 15, and the first organic layer 13, that is, the planarization layer 15, has different thicknesses in different transparent regions 111a. Exemplarily, the first organic layer 13 has thickness d6 in light-transmitting region B6 and thickness d6' in adjacent light-transmitting region B6', where d6 has a different than d6'. Then, the planarization layer 15 in the multiple transparent regions 111a may have different thicknesses than other parts of the transparent display region.

Figure 10:
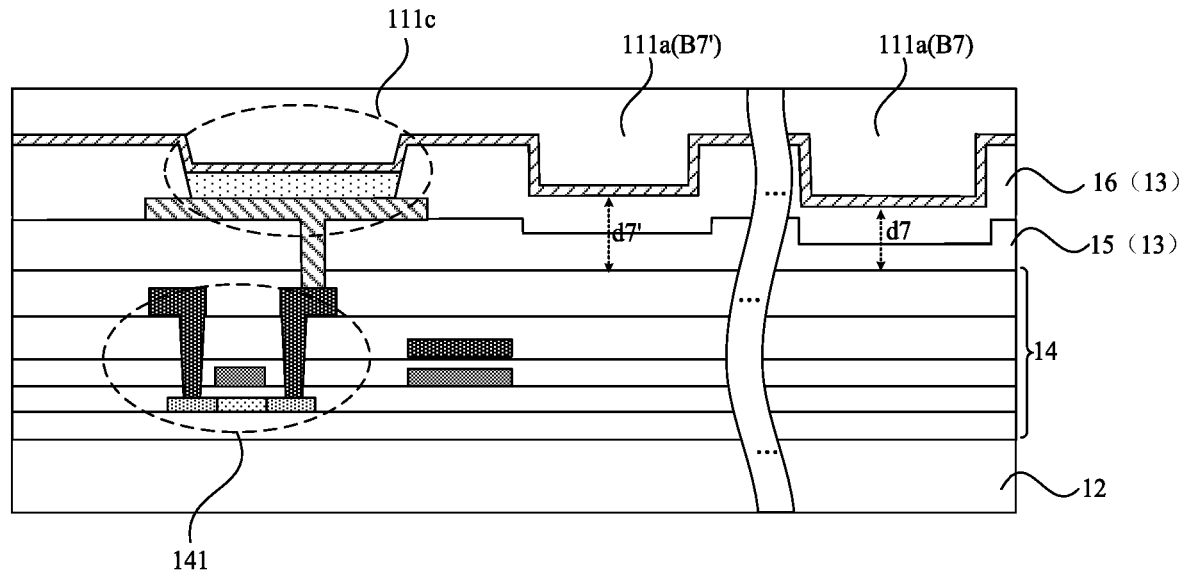
FIG. 10 is a partial sectional view of another display panel according to an embodiment of the present disclosure.

FIG. 10 is a sectional view of another display panel according to an embodiment of the present disclosure. In one embodiment, the first organic layer 13 may include both the planarization layer 15 and the pixel definition layer 16, and the first organic layer 13, that is, the planarization layer 15 and the pixel definition layer 16, has different thicknesses in different transparent regions 111a. Exemplarily, the first organic layer 13 has thickness d7 in light-transmitting region B7 and has thickness d7' in adjacent light-transmitting region B7', where d7 has a different value than d7'. Then, the planarization layer 15 in the multiple transparent regions 111a may have a different thickness than other parts of the transparent display region, and the pixel definition layer 16 in the multiple transparent regions 111a may have a different thickness than other parts of the transparent display region. In this way, the first organic layer 13 has more thickness selection intervals in the light transmission regions 111a, effectively reducing the diffraction.

In one embodiment, each first light-emitting element 111c may be an organic light-emitting element or a micro inorganic light-emitting element. Referring to FIGS. 8 to 10, each first light-emitting element 111c is the organic light-emitting element by way of example in this embodiment. In one embodiment, each first light-emitting element 111c may be the micro inorganic light-emitting element, and the specific element type of each first light-emitting element 111c is not limited in this embodiment.

Figure 11:
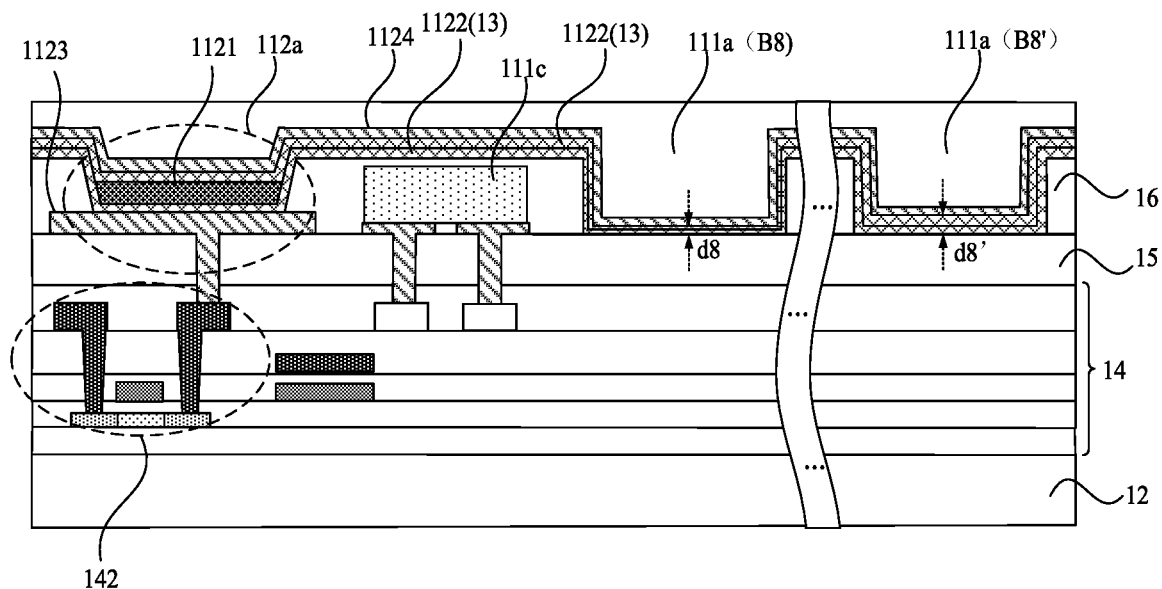
FIG. 11 is a partial sectional view of another display panel according to an embodiment of the present disclosure.

FIG. 11 is a sectional view of another display panel according to an embodiment of the present disclosure. In one embodiment, the display panel may further include multiple second light-emitting elements 112a, where each second light-emitting elements 112a is the organic light-emitting element and includes a light-emitting layer 1121 and an auxiliary light-emission function layer 1122, and the auxiliary light-emission function layer 1122 of at least one second light-emitting element 112a is made of the same material and disposed in the same layer as the first organic layer 13 disposed in at least one light-transmitting region 111a.

Figure 12:
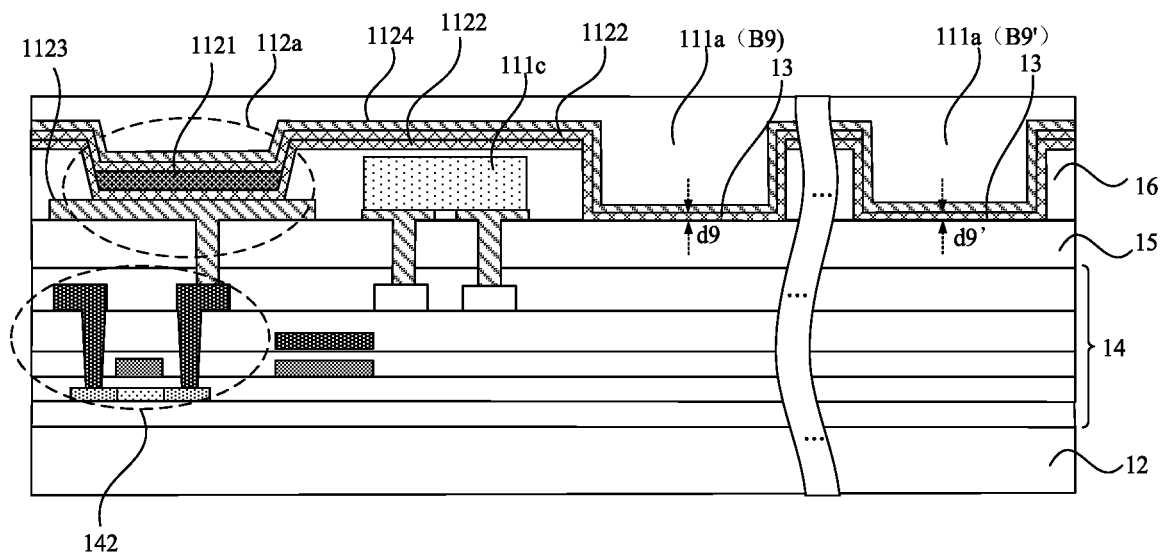
FIG. 12 is a partial sectional view of another display panel according to an embodiment of the present disclosure.

As shown in FIG. 11, the display panel may further include the multiple second light-emitting elements 112a, where each second light-emitting elements 112a is the organic light-emitting element that mainly includes a first electrode 1123, a light-emitting layer 1121 and a second electrode 1124. The light-emitting layer 1121 may be stimulated to emit light under the action of electrons and holes between the first electrode 1123 and the second electrode 1124 for the purpose of displaying images, and the first electrode 1123 and the second electrode 1124 transmit the holes and electrons to the light-emitting layer 1121 under the action of a voltage difference. The display panel may further include second driving circuits 142 in one-to-one correspondence with the multiple second light-emitting elements 112a, and the second driving circuits 142 are configured to provide operating voltages for the first electrode 1123 and the second electrode 1124. In order to accelerate the hole and electron transmission from the first electrode 1123 and the second electrode 1124 to the light-emitting layer 1121, each second light-emitting element 112a in this embodiment further includes the auxiliary light-emission function layer 1122 disposed on one side or both sides of the light-emitting layer 1121. The first organic layer 13 may be a film of the auxiliary light-emission function layer 1122 extending to the transparent display region, and the first organic layer 13 disposed in the at least one light-transmitting region 111a is disposed in the same layer and made of the same material as the auxiliary light-emission function layer 1122 of the at least one second light-emitting element 112a. That is, the first organic layer 13 disposed in the at least one light-transmitting region 111a may be formed from the auxiliary light-emission function layer 1122 extending to the transparent display region. Exemplarily, as shown in FIG. 12, the first organic layer 13 in light-transmitting region B8 is made of the same material, disposed in the same layer and have the same thickness as the auxiliary light-emission function layer 1122 of the at least one second light-emitting element 112a. In this example, the first organic layer 13 in light-transmitting region B8' adjacent to light-transmitting region B8 is made of the same material as the auxiliary light-emission function layer 1122, but thickness d8' of the first organic layer 13 in light-transmitting region B8' is different from thickness d8 of the first organic layer 13 in light-transmitting region B8.

FIG. 12 is a sectional view of another display panel according to an embodiment of the present disclosure. In one embodiment, the auxiliary light-emission function layer 1122 may include at least two of a hole injection layer, a hole transmission layer, an electron blocking layer, a hole blocking layer, an electron transmission layer and an electron injection layer. Each film layer of the first organic layer 13 in the multiple transparent regions 111a is made of the same material and disposed in the same layer as a respective film layer in the auxiliary light-emission function layer 1122. For film layers of the first organic layer 13 in at least two transparent regions 111a, the at least two transparent regions 111a have different film quantities.

In one embodiment, the first electrode 1123 may be an anode, the second electrode 1124 may be a cathode, the hole injection layer helps the hole overflow from the first electrode 1123, the hole transmission layer helps the hole transmission from the first electrode 1123 to the light-emitting layer 1121, and the electron blocking layer can block the transmission of electrons in the light-emitting layer 1121 along a direction toward the first electrode 1123. Between the first electrode 1123 and the light-emitting layer 1121, the hole injection layer, the hole transmission layer and the electron blocking layer may be sequentially disposed along the direction from the first electrode 1123 to the light-emitting layer 1121. In one embodiment, only at least one of the hole injection layer, the hole transmission layer and the electron blocking layer may be disposed, which is not limited in this embodiment. Similarly, the electron injection layer helps the electron overflow from the second electrode 1124, the electron transmission layer helps the electron transmission from the second electrode 1124 to the light-emitting layer 1121, and the hole blocking layer can block the transmission of holes in the light-emitting layer 1121 along a direction toward the second electrode 1124. Between the second electrode 1124 and the light-emitting layer 1121, the electron injection layer, the electron transmission layer and the hole blocking layer may be sequentially disposed along the direction from the second electrode 1124 to the light-emitting layer 1121. In one embodiment, only at least one of the electron injection layer, the electron transmission layer and the hole blocking layer may be disposed. The material of the first organic layer 13 in at least one light-transmitting region 111a is not completely the same as the material of the auxiliary light-emitting function layer 1122. Exemplarily, as shown in FIG. 12, the auxiliary light-emission function layer 1122 of each second light-emitting element 112a includes the auxiliary light-emission function layer 1122 between the first electrode 1123 and the light-transmitting layer 1121 and also includes the auxiliary light-emission function layer 1122 between the second electrode 1124 and the light-emitting layer 1121, but the first organic layer 13 in each light-transmitting region 111a may include only the auxiliary light-emission function layer 1122 between the second electrode 1124 and the light-transmitting layer 1121. As shown in FIG. 12, the first organic layer 13 in light-transmitting region B9 has thickness d9 and includes the auxiliary light-emission function layer 1122 between the second electrode 1124 and the light-transmitting layer 1121, and the first organic layer 13 in light-transmitting region B9' has thickness d9' and includes the auxiliary light-emission function layer 1122 between the first electrode 1123 and the light-transmitting layer 1121. The first organic layer 13 is made of different materials in light-transmitting region B9 and in light-transmitting region B9, and thickness d9 is different from thickness d9'. Exemplarily, if the auxiliary light-emission function layer 1122 of each light-emitting element includes the hole injection layer, the hole transmission layer, the electron injection layer and the electron transmission layer, then the first organic layer 13 includes two stacked film layers in at least one light-transmitting region 111a, where a first film is made of the same material and disposed in the same layer as the electron injection layer and a second film is made of the same material and disposed in the same layer as the electron transmission layer; and the first organic layer 13 includes three stacked film layers in at least another light-transmitting region 111a, where a first film layer is made of the same material and disposed in the same layer as the hole transmission layer, a second film is made of the same material and disposed in the same layer as the electron injection layer, and a third film is made of the same material and disposed in the same layer as the electron transmission layer. Film layers made of the same material as film layers in the auxiliary light-emission function layer 1122 are selectively disposed in different transparent regions 111a in a manner of same-layer manufacturing, so that the different transparent regions 111a has different film quantities, and this helps form the first organic layer 13 having different thicknesses. The same material for forming the portion of the first organic layer 13 and the auxiliary light-emission function layer is not limited in this embodiment It is to be noted that the first organic layer 13 may be formed by film layers in the auxiliary light-emission function layer 1122 extending to the transparent display region. That is, the auxiliary light-emission function layer 1122 and the first organic layer 13 form film layers covering the whole display region. In one embodiment, the first organic layer 13 may be disposed only in the multiple transparent regions 111a, and the auxiliary light-emission function layer 1122 may be disposed at the positions of the multiple second light-emitting elements 112a. That is, the auxiliary light-emission function layer 1122 and the first organic layer 13 are each arranged in an array in the display area. This saves the material costs of the first organic layer 13 and the auxiliary light-emission function layer 1122, and helps configure different thicknesses for the first organic layer 13 in the multiple transparent regions 111a.

Figure 13:
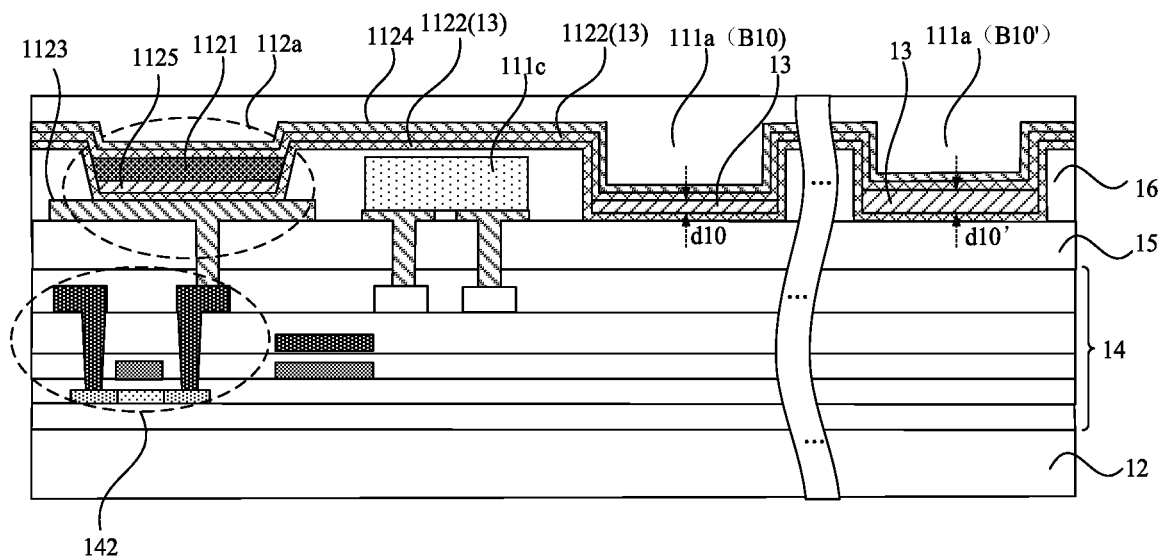
FIG. 13 is a partial sectional view of another display panel according to an embodiment of the present disclosure.

FIG. 13 is a sectional view of another display panel according to an embodiment of the present disclosure. In one embodiment, the display panel may further include multiple second light-emitting elements 112a, where each second light-emitting elements 112a is an organic light-emitting element and includes a first electrode 1123, a second electrode 1124, a light-emitting layer 1121 disposed between the first electrode 1123 and the second electrode 1124, and a light-emission compensation layer 1125 disposed between the first electrode 1123 and the light-emitting layer 1121. The multiple second light-emitting elements 112a include a first-color organic light-emitting element, a second-color organic light-emitting element and a third-color organic light-emitting element, where light-emission compensation layers 1125 of the first-color organic light-emitting element, the second-color organic light-emitting element and the third-color organic light-emitting element have different thicknesses. The first organic layer 13 disposed in at least one light-transmitting region 111a is made of the same material and has the same thickness as the light-emission compensation layer 1125 of the first-color organic light-emitting element. The first organic layer 13 disposed in at least another light-transmitting region 111a is made of the same material and has the same thickness as the light-emission compensation layer 1125 of the second-color organic light-emitting element. The first organic layer 13 disposed in at least another light-transmitting region 111s is made of the same material and has the same thickness as the light-emission compensation layer 1125 of the third-color organic light-emitting element.

The multiple second light-emitting elements 112a include the first-color organic light-emitting element, the second-color organic light-emitting element and the third-color organic light-emitting element. In one embodiment, a first color, a second color and a third color may be red, green and blue for the purpose of images display. A micro cavity structure may be disposed in the organic light-emitting element to improve the light emission efficiency and the brightness of the organic light-emitting element. The micro cavity structure is formed by multiple film layers between the first electrode 1123 and the second electrode 1124, and the thickness sum is the cavity length of the micro cavity structure. The cavity length of the micro cavity may be adjusted through thickness adjustments of film layer in the micro cavity structure, so that the organic light-emitting element meets optical performance indicators. Organic light-emitting elements emitting light of different colors require different cavity lengths. In this embodiment, each second light-emitting element 112a may further include the light-emission compensation layer 1125 between the first electrode 1123 and the light-emitting layer 1121, and light-emission compensation layers 1125 of the organic light-emitting elements emitting light of different colors have different thicknesses. As shown in FIG. 13, if each second light-emitting element 112a further includes an auxiliary light-emission function layer 1122, the light-emission compensation layer 1125 may be disposed between the first electrode 1123 and the auxiliary light-emission function layer 1122, or may be disposed between the auxiliary light-emission function layer 1122 and the light-emitting layer 1121, which is not limited in this embodiment. In this embodiment, the first organic layer 13 is made of the same material and disposed in the same layer as the light-emission compensation layer 1125. The first organic layer 13 disposed in the at least one light-transmitting region 111a is made of the same material and has the same thickness as the light-emission compensation layer 1125 of the first-color organic light-emitting element. The first organic layer 13 disposed in the at least another light-transmitting region 111a is made of the same material and has the same thickness as the light-emission compensation layer 1125 of the second-color organic light-emitting element. The first organic layer 13 disposed in the at least another light-transmitting region 111s is made of the same material and has the same thickness as the light-emission compensation layer 1125 of the third-color organic light-emitting element. Moreover, the first organic layer 13 has different thicknesses in adjacent transparent regions 111a. This efficiently reduces the diffraction. Exemplarily, as shown in FIG. 13, the first organic layer 13 in light-transmitting region B10 is made of the same material and has the same thickness d10 as the light-emission compensation layer 1125 of one second light-emitting element, and the first organic layer 13 in light-transmitting region B 10' adjacent to light-transmitting region B10 is made of the same material and has the same thickness d10' as the light-emission compensation layer 1125 of another second light-emitting element, where thickness d10 is different from thickness d10'.

Similarly, the first organic layer 13 may be disposed through the light-emission compensation layer 1125 extending to the transparent display region, or may be disposed only in the multiple transparent regions 111a, and the light-emission compensation layer 1125 may be disposed at the positions of the multiple second light-emitting elements 112a. That is, the light-emission compensation layer 1125 and the first organic layer 13 are each arranged in an array in the display area. This saves the material cost of the first organic layer 13 and the light-emission compensation layer 1125, and helps configure different thicknesses for the first organic layer 13 in the multiple transparent regions 111a.

In one embodiment, the first organic layer 13 may be formed in a printing manner. In one embodiment, the first organic layer 13 may be formed in an inkjet printing manner. Additionally, the preceding light-emission compensation layer 1125 and the auxiliary light-emission function layer 1122 may each be formed in a printing manner. The printing manner makes printed film layers uniform in thickness, saves the material and supports mass production, improving the production efficiency of the display panel. Additionally, when the preceding film layers are each arranged in an array in the display area, the printing manner can directly provide film blocks arranged in an array and avoid the process operations of etching, punching and the like during the forming of the film blocks, saving the manufacturing process. In this embodiment, the thicknesses of some regions of a printed film may be controlled through the size control of the droplets on a print head. This can configure different thicknesses for the first organic layer 13 and configure different thicknesses for the light-emission compensation layer 1125, and the operation is simple and accurate.

Figure 14:
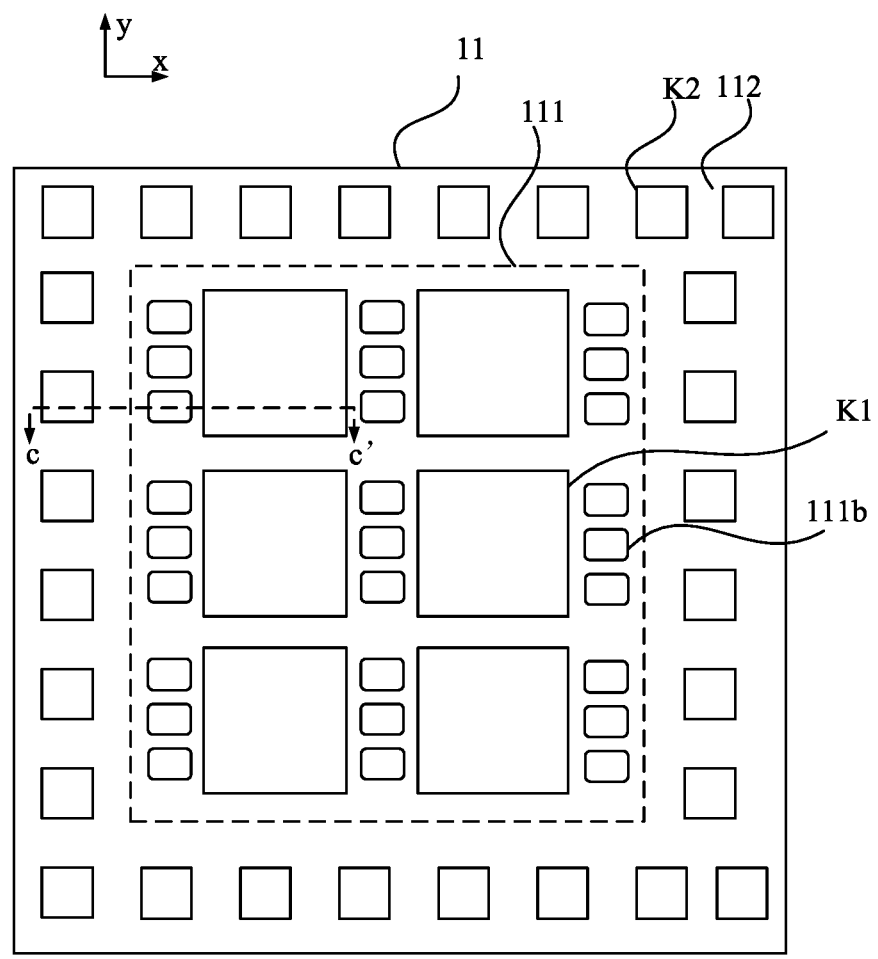
FIG. 14 is a structural diagram of another display panel according to an embodiment of the present disclosure.
Figure 15:
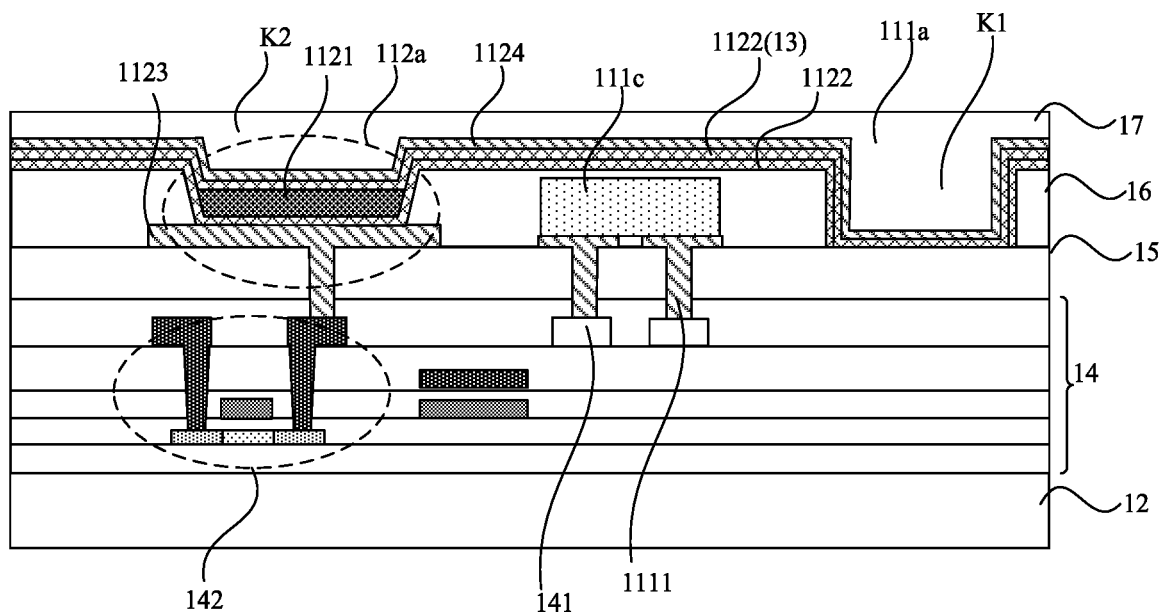
FIG. 15 is a sectional view of the display panel taken along a section line c-c' of FIG. 14.

FIG. 14 is a structural diagram of another display panel according to an embodiment of the present disclosure, and FIG. 15 is a sectional view of the display panel taken along section line c-c' of FIG. 14. In one embodiment, referring to FIGS. 14 and 15, the display panel may further include a pixel definition layer 16 provided with multiple first openings K1 and multiple second openings K2. The multiple first openings K1 are disposed in the multiple transparent regions 111a and the first organic layer 13 in the multiple transparent regions 111a is disposed in the multiple first openings K1, and the multiple second light-emitting elements 112a are disposed in the multiple second openings K2. The pixel definition layer 16 is made of a hydrophobic material.

Each second light-emitting element 112a of the display panel is an organic light-emitting element, and thus the pixel definition layer 16 needs to be provided with openings and first electrodes 1123 of the multiple second light-emitting elements 112a are exposed from the openings. The pixel definition layer 16 may be provided with the multiple second openings K2 in one-to-one correspondence with the multiple second light-emitting elements 112a, so that the multiple second light-emitting elements 112a are disposed in the multiple second openings K2. Moreover, the pixel definition layer 16 may be provided with the multiple first openings K1 in one-to-one correspondence with the multiple transparent regions 111a, so that the first organic layer 13 in the multiple transparent regions is disposed in the multiple first openings K1. In this embodiment, the pixel definition layer 16 is made of the hydrophobic material, and then it is easy to fix the auxiliary light-emission function layer 1122 and the first organic layer 13 at disposing positions during the forming of the auxiliary light-emission function layer 1122 and the first organic layer 13 in a printing manner, avoiding the overflow problem of the liquid material and improving the manufacturing accuracy of the auxiliary light-emission function layer 1122 and the first organic layer 13.

In one embodiment, continuing to refer to FIGS. 14 and 15, the transparent display region 111 may be a photosensor disposing region, the display area 11 further includes a conventional display region 112, and the display panel further includes multiple second light-emitting elements 112a disposed in the conventional display region. Each first light-emitting element 111c is a micro inorganic light-emitting diode, and each second light-emitting element 112a is an organic light-emitting diode.

The transparent display region 111 may be reused as the photosensor disposing region, and a photosensor such as a camera, a light sensor or the like may be disposed at a position corresponding to the photosensor disposing region on the non-emissive side of the display panel. This can meet the preceding photosensor disposing requirement without decreasing the area of the display area 11 and increase the screen-to-body ratio of the display panel, implementing a full-screen disposing of a display device. Exemplarily, as shown in FIG. 15, the conventional display region 112 may be disposed surrounding the transparent display region 111. Each second light-emitting element 112a in the conventional display region 112 is the organic light-emitting diode and used for the images display of the conventional display region 112. Each first light-emitting element 111c in the transparent display region 111 is the micro inorganic light-emitting diode with a much less size than the organic light-emitting diode in the conventional display region 112. The organic light-emitting diode occupies a smaller area while meeting the required resolution, increases the disposing area or the disposing quantity of the transparent regions 111a and enhances the perspective effect of the display panel, and enables the photosensor on the non-emissive side of the display panel to obtain strong perspective light, improving the measurement accuracy of the photosensor. For example, for the camera, the solution of this embodiment can improve the shooting definition and enhance the shooting experience.

In one embodiment, continuing to refer to FIG. 14 and FIG. 15, the display panel may further include a driving circuit layer 14, a planarization layer 15, a bonding layer 1111 of the micro inorganic light-emitting diode 1124, a pixel defining layer 16 and an organic layer. The driving circuit layer 14 includes an organic light-emitting diode driving circuit (a second driving circuit 142) in the conventional display region 112 and a micro inorganic light-emitting diode driving circuit (a first driving circuit that is not shown in FIG. 16) in the transparent display region 111. The planarization layer 15 is disposed on one side of the driving circuit layer 14 facing away from the substrate 12, where the organic light-emitting diode includes a first electrode 1123, a light-emitting layer 1121 and a second electrode 1124 that are stacked together, and the first electrode 1123 is disposed on one side of the planarization layer 15 facing away from the driving circuit layer 14. The bonding layer 1111 of the micro inorganic light-emitting diode is disposed on one side of the planarization layer 15 facing away from the driving circuit layer 14, where the micro inorganic light-emitting diode is bonded to the bonding layer 1111. The pixel defining layer 16 is disposed on one side of the micro inorganic light-emitting diode facing away from the bonding layer 1111 and is provided with first openings and second openings, where the first openings are disposed in the multiple transparent regions and first electrodes are partially exposed from the second openings. The organic layer and the light-emitting layer are disposed on one side of the pixel defining layer facing away from the first electrode, and the organic layer includes an auxiliary light-emission function layer 1122 of the organic light-emitting diode and a first organic layer 13 of the multiple transparent regions, where the auxiliary light-emission function layer 1122 and the light-emitting layer 1121 are disposed in the second openings K2 and the first organic layer 13 is disposed in the first openings. The first organic layer 13 has different thicknesses in at least part of the multiple transparent regions 111a.

Along a direction perpendicular to the display panel, the display panel sequentially includes the substrate 12, the driving circuit layer 14 and the planarization layer 15. The driving circuit layer 14 includes the first driving circuit for driving a first light-emitting element and the second driving circuit for driving a second light-emitting element. In this embodiment, the second light-emitting element is the organic light-emitting diode and the second driving circuit is the organic light-emitting diode driving circuit, and the first light-emitting element is the micro inorganic light-emitting diode and the first driving circuit is the micro inorganic light-emitting diode driving circuit. The planarization layer 15 is disposed on one side of the driving circuit layer 14 facing away from the substrate 12 and provides a flat substrate for disposing the first light-emitting element and the second light-emitting element.

First, the first electrode 1123 of the organic light-emitting diode and the bonding layer 1111 of the micro inorganic light-emitting diode may be formed on one side of the planarization layer 15 facing away from the substrate 12, and then, the crystal grains of the micro inorganic light-emitting diode are bonded to the bonding layer 1111. After the disposing of the micro inorganic light-emitting diode, the pixel defining layer 16 is disposed on one side of the micro inorganic light-emitting diode facing away from the bonding layer 1111 and includes the first openings K1 and the second openings K2. The first openings K1 are disposed in one-to-one correspondence with the multiple transparent regions 111a and are disposed in the multiple transparent regions 111a. The second openings K2 are disposed in one-to-one correspondence with the first electrodes 1123 and the first electrodes 1123 are partially exposed from the second openings K2. The auxiliary light-emission function layer 1122 and the light-emitting layer 1121 are disposed in the second openings K2, and the auxiliary light-emission function layer 1122 may extend to the whole conventional display region 112 to form the organic layer. The first organic layer 13 is disposed in the multiple transparent regions 111a and may extend to the whole transparent display region 111 to form the organic layer. Thus, the auxiliary light-emission function layer 1122 and the first organic layer 13 form the whole organic layer. Moreover, the first organic layer 13 has different thicknesses the at least part of the multiple transparent regions 111a, reducing the diffraction of the multiple transparent regions 111a.

Figure 16:
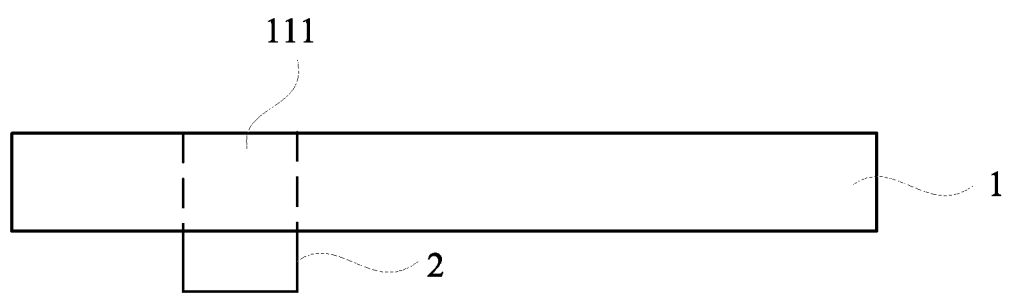
FIG. 16 is a structural diagram of a display device according to an embodiment of the present disclosure.

An embodiment of the present disclosure further provides a display device. FIG. 16 is a structural diagram of a display device according to an embodiment of the present disclosure. As shown in FIG. 16, the display device includes the display panel 1 of any embodiment of the present disclosure and a photosensor 2 disposed with respect to the transparent display region 111 of the display panel 1. The photosensor 2 may be a camera, a light sensor or the like.

The display device provided in this embodiment may be a mobile phone, or may be a computer, a television, a smart wearable device or the like, which is not In one embodiment limited in the embodiment of the present disclosure.

Figure 17:
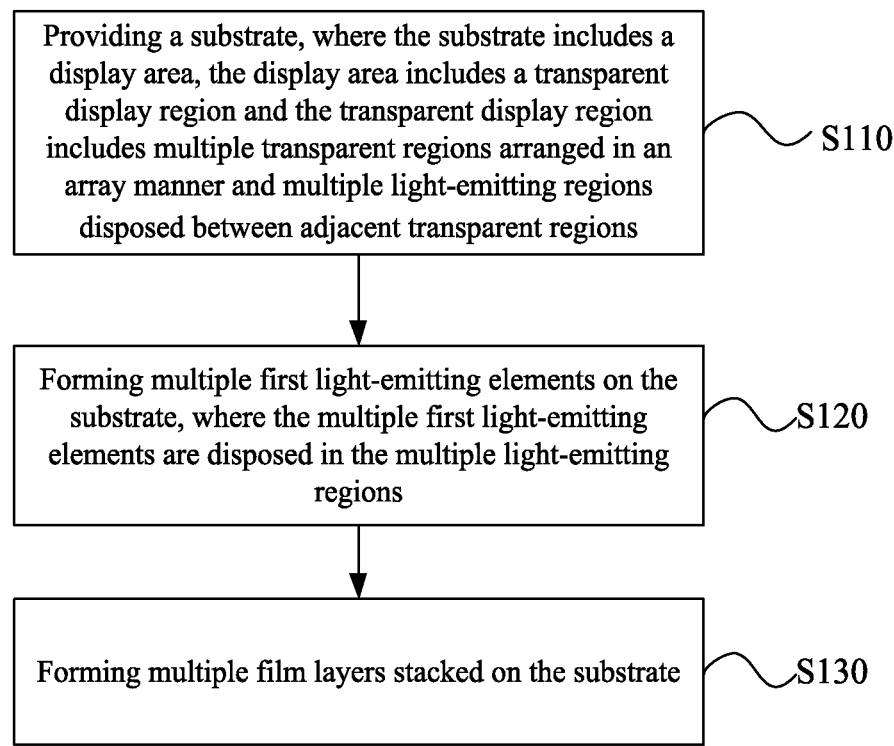
FIG. 17 is a flowchart of a manufacturing method of a display panel according to an embodiment of the present disclosure.
Figure 18:
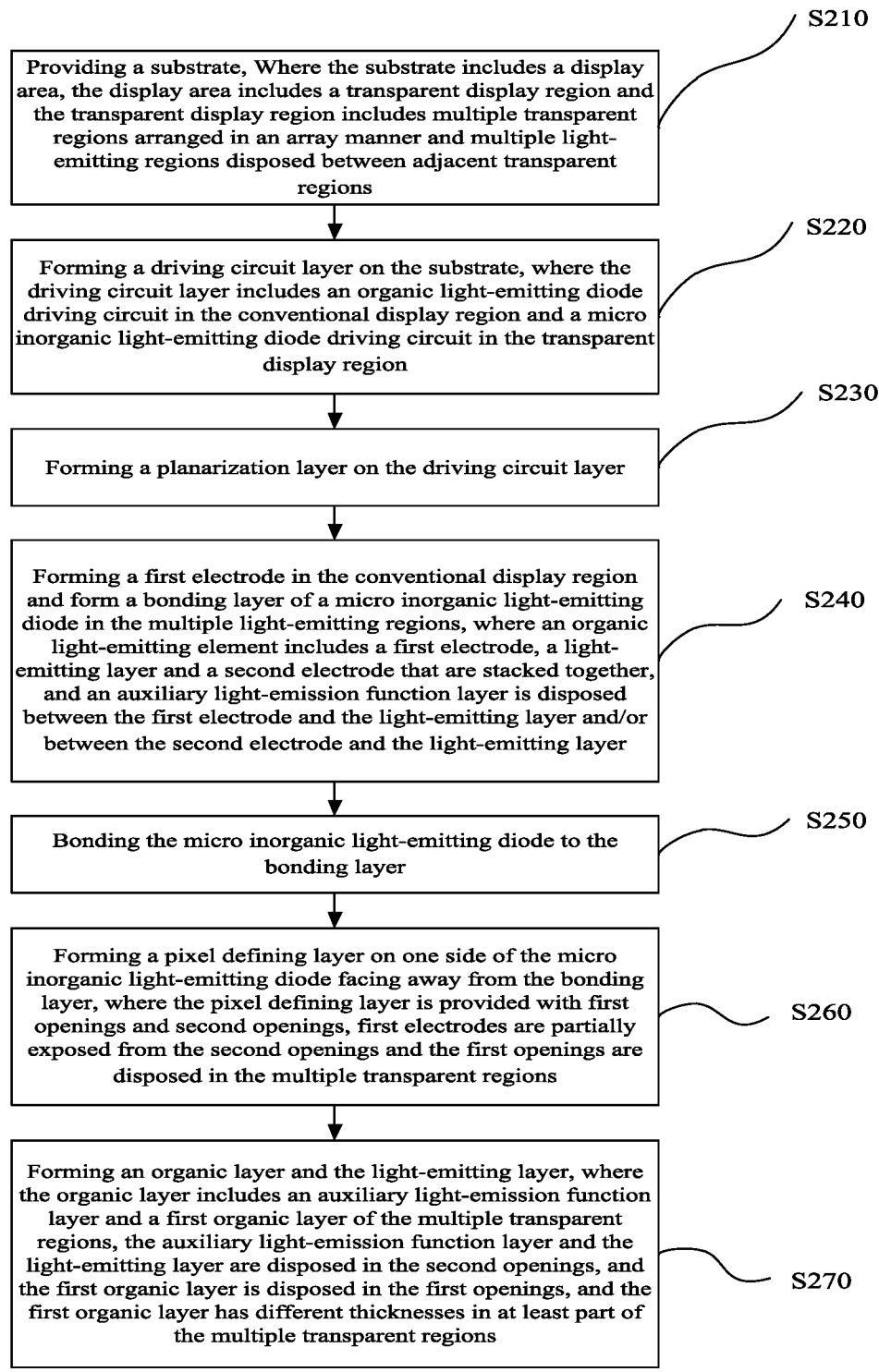
FIG. 18 is a flowchart of a manufacturing method of another display panel according to an embodiment of the present disclosure.

Based on the same inventive concept, an embodiment of the present disclosure further provides a manufacturing method of a display panel. FIG. 17 is a flowchart of a manufacturing method of a display panel according to an embodiment of the present disclosure. As shown in FIG. 17, this embodiment includes the steps described below.

In step S110, a substrate including a display area is provided, where the display area includes a transparent display region, and the transparent display region includes multiple transparent regions arranged in an array and multiple light-emitting regions disposed between adjacent transparent regions.

In step S120, multiple first light-emitting elements are formed on the substrate, where the multiple first light-emitting elements are disposed in the multiple light-emitting regions.

In step S130, multiple film layers stacked are formed on the substrate, where in the transparent display region, the film layers in at least two adjacent transparent regions have different thicknesses and/or the film layers in the at least two adjacent transparent regions are made of different film materials.

In this embodiment of the present disclosure, the display area of the display panel includes the transparent display region, where the transparent display region includes the multiple transparent regions distributed in an array and the multiple light-emitting regions disposed between the adjacent transparent regions for the purpose of transparent display, so that a user can view objects or images on a non-emissive side of the display panel. In one embodiment, the multiple first light-emitting elements are disposed on one side of the substrate and in the multiple light-emitting regions for the purpose of light emission and display. In the transparent display region, the film layers in the at least two adjacent transparent regions have different thicknesses or are made of different materials, or the film layers in the at least two adjacent transparent regions have different film materials thicknesses and different film materials. Thus, an optical path or a phase difference can be adjusted when external light passes through adjacent transparent regions, so that the multiple transparent regions arranged in an array are not to form a fixed grating. Then, it is difficult for the multiple transparent regions to diffract the external light ray for the reason of the periodic arrangement when the external light passes through the multiple transparent regions, enhancing the stability of the light-transmitting display of the display panel, preventing the display distortion of the display panel and enhancing the display effect.

Figure 19:
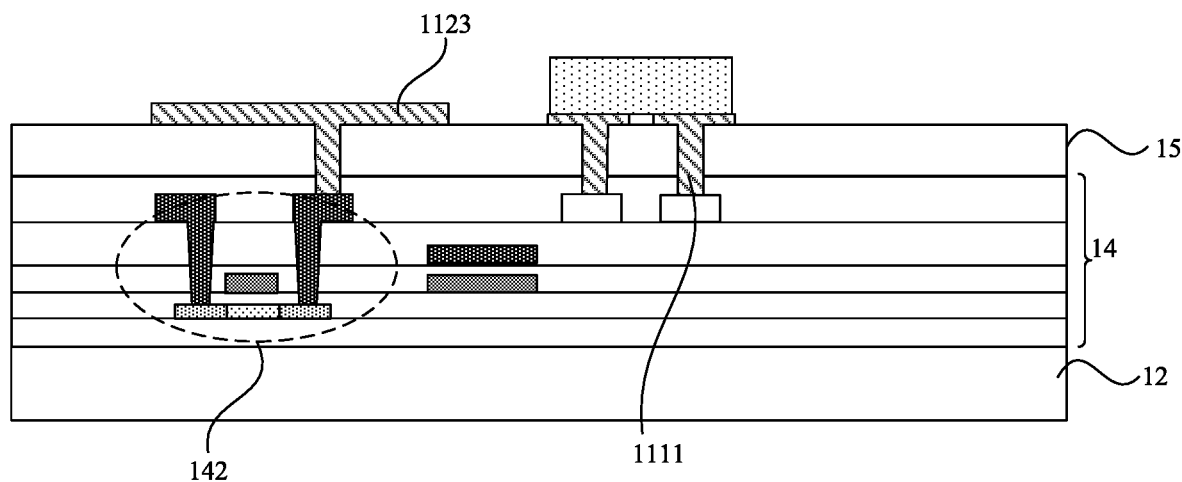
FIG. 19 is a structural diagram of a display panel after the forming of a first electrode and a bonding layer according to an embodiment of the present disclosure.

Based on the preceding embodiment, an embodiment of the present disclosure further provides a manufacturing method of a display panel. The display panel includes a transparent display region and a conventional display region. The transparent display region includes first light-emitting elements, and the conventional display region includes second light-emitting elements. Each first light-emitting element may be a micro inorganic light-emitting diode, and each second light-emitting element may be an organic light-emitting diode. FIG. 19 is a flowchart of a manufacturing method of another display panel according to an embodiment of the present disclosure, and the method of this embodiment includes the steps described below.

In step S210, a substrate including a display area is provided, where the display area includes the transparent display region and the transparent display region includes multiple transparent regions distributed in an array and multiple light-emitting regions disposed between adjacent transparent regions.

In step S220, a driving circuit layer is formed on the substrate, where the driving circuit layer includes an organic light-emitting diode driving circuit in the conventional display region and a micro inorganic light-emitting diode driving circuit in the transparent display region.

In step S230, a planarization layer is formed on the driving circuit layer.

In step S240, a first electrode is formed in the conventional display region and a bonding layer of a micro inorganic light-emitting diode is formed in the multiple light-emitting regions, where an organic light-emitting element includes a first electrode, a light-emitting layer and a second electrode that are stacked together, and an auxiliary light-emission function layer is disposed between the first electrode and the light-emitting layer and/or between the second electrode and the light-emitting layer.

FIG. 19 is a structural diagram of a display panel after the forming of a first electrode and a bonding layer according to an embodiment of the present disclosure. The first electrode 1123 and the bonding layer 1111 of the micro inorganic light-emitting diode are disposed on one side of the planarization layer 15 facing away from the driving circuit layer 14. The first electrode 1123 is electrically connected to a respective second driving circuit 142 through a via, and the bonding layer 1111 is electrically connected to first driving circuits through vias.

In step S250, the micro inorganic light-emitting diode is bonded to the bonding layer.

Continuing to refer to FIG. 19, the micro inorganic light-emitting diode is directly bonded to the bonding layer 1111, and the disposing of the first light-emitting elements is completed.

In step S260, a pixel defining layer is formed on one side of the micro inorganic light-emitting diode facing away from the bonding layer and is provided with first openings and second openings, where first electrodes are exposed from the second openings and the first openings are disposed in the multiple transparent regions.

Figure 20:
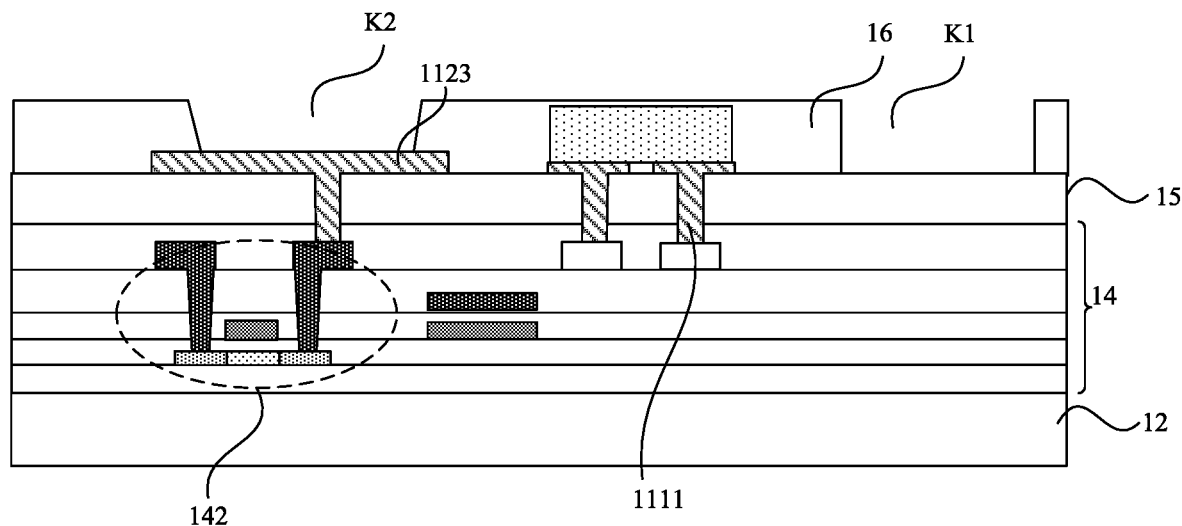
FIG. 20 is a structural diagram of a display panel after the forming of a pixel defining layer according to an embodiment of the present disclosure.

FIG. 20 is a structural diagram of a display panel after the forming of a pixel defining layer according to an embodiment of the present disclosure. The pixel defining layer 16 is provided with the first openings K1 and the second openings K2, where the first electrodes are partially exposed from the second openings K2 and the first openings K1 are disposed in the multiple transparent regions.

In step S270, an organic layer and the light-emitting layer are formed, where the organic layer includes an auxiliary light-emission function layer and a first organic layer of the multiple transparent regions. The auxiliary light-emission function layer and the light-emitting layer are disposed in the second openings, and the first organic layer is disposed in the first openings. The first organic layer has different thicknesses in at least part of the multiple transparent regions.

Figure 21:
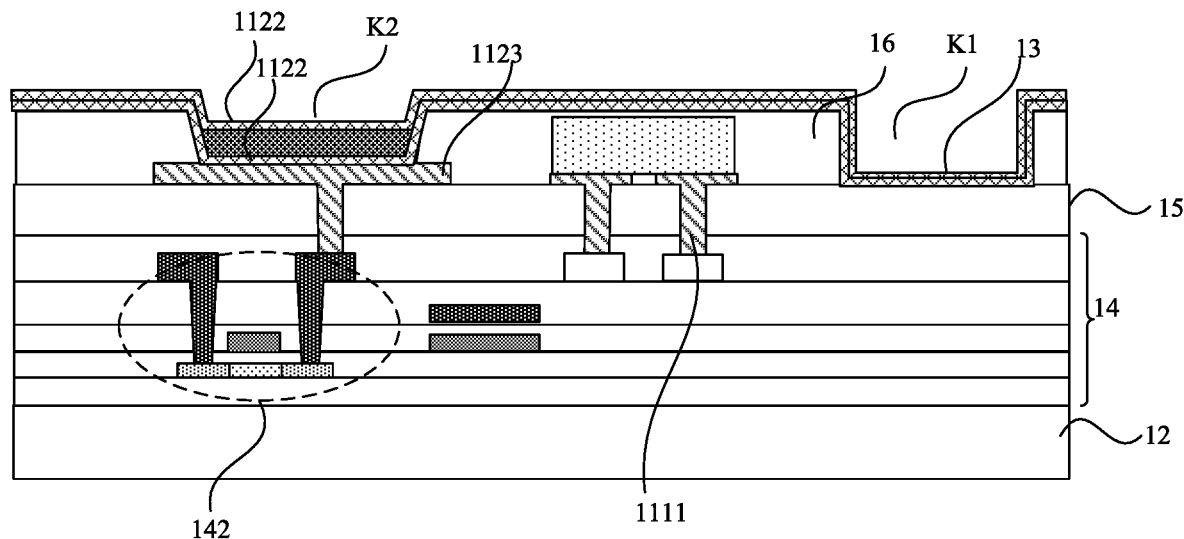
FIG. 21 is a structural diagram of a display panel after the forming of an organic layer and a light-emitting layer according to an embodiment of the present disclosure.

FIG. 21 is a structural diagram of a display panel after the forming of an organic layer and a light-emitting layer according to an embodiment of the present disclosure. The organic layer may include the auxiliary light-emission function layer 1122 between the first electrode 1123 and the light-emitting layer 1121, or may include the auxiliary light-emission function layer 1122 on one side of the light-emitting layer 1121 facing away from the first electrode 1123. The auxiliary light-emission function layer 1122 and the light-emitting layer 1121 are disposed in the second openings K2, and the first organic layer 13 is disposed in the first openings K1. The first organic layer 13 is made of the same material and disposed in the same layer as part of the auxiliary light-emission function layer 1122. Additionally, referring to FIG. 16, a second electrode 1124 may further be formed on the auxiliary light-emission function layer 1122, and a protective cover 17 may be disposed on the second electrode 1124 to form a complete display panel. In this example, the first organic layer 13 may be formed from the auxiliary light-emission function layer 1122 extending to the transparent display region. The first organic layer 13 may be disposed only in the first openings K1, and the auxiliary light-emission function layer 1122 may be disposed only in the second openings K2. That is, the first organic layer 13 is arranged in an array in the transparent display region, and the auxiliary light-emission function layer 1122 is arranged in an array in the conventional display region.

In this embodiment, micro inorganic light-emitting diodes are used as the first light-emitting elements, and the area of the multiple transparent regions is increased while the first light-emitting elements are configured in a same density as the second light-emitting elements is ensured, so that the transparent display region of the display panel has a better perspective effect. Moreover, the micro inorganic light-emitting diode can obtain a larger pixel density than the organic light-emitting diode on the premise of satisfying the perspective effect.

Figure 22:
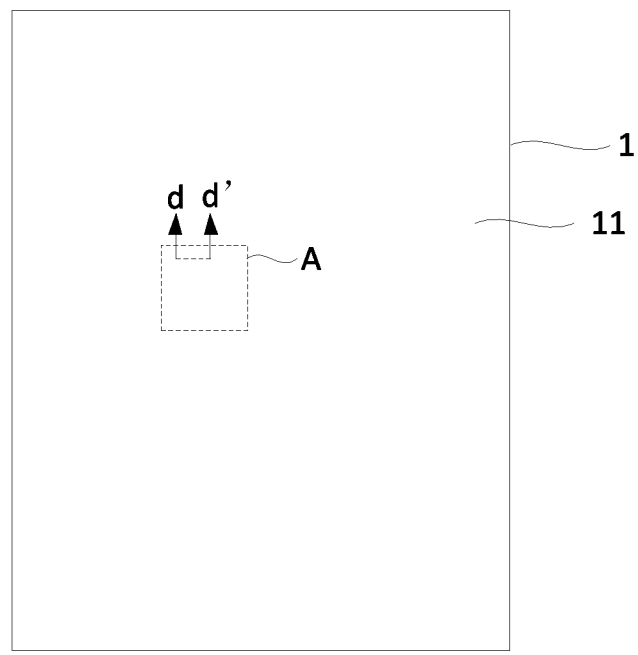
FIG. 22 is a structural diagram of a display panel according to an embodiment of the present disclosure.
Figure 23:
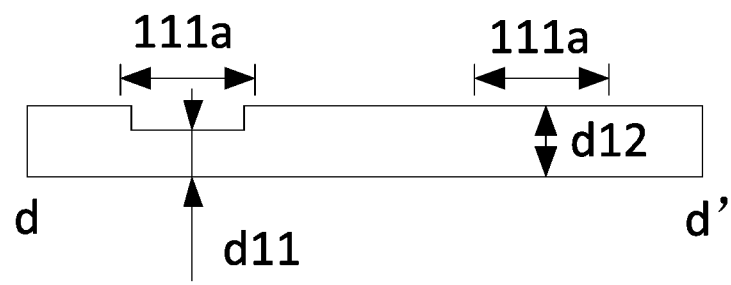
FIG. 23 is a sectional view of the display panel taken along a section line d-d' of FIG. 22.

FIG. 22 is a structural diagram of a display panel according to an embodiment of the present disclosure, and FIG. 23 is a sectional view of the display panel taken along a section line d-d' of FIG. 22. As shown in FIGS. 22 and 23, the display panel 1 includes a display area 11, the display area 11 includes transparent regions 111a, and film layers in at least two transparent regions 111a have different thicknesses. FIG. 23 illustrates two transparent regions 111a, a thickness d11 of film layers in one transparent region of two transparent regions 111a is less than a thickness d12 of film layers in the other transparent region of two transparent regions 111a. In addition, the two transparent regions 111a in which the thicknesses of film layers are different may be configured to be adjacent to each other, or configured at an interval.

When comparing with the thicknesses of the film layers in the two transparent regions 111a, the thicknesses of the film layers that are located at a same position in the two transparent regions 111a may be compared. For example, the thicknesses of the film layers that are located at bottom left of the two transparent regions 111a may be compared, or the thicknesses of the film layers that are located at a relative position of the two transparent regions 111a may be compared, and the relative position refers to a position located in relation to the transparent region 111a. In another example, by taking a center line configured between the two transparent regions 111a as a symmetry axis, the thicknesses of the film layers that are located at symmetrical positions may be compared.

Figure 24:
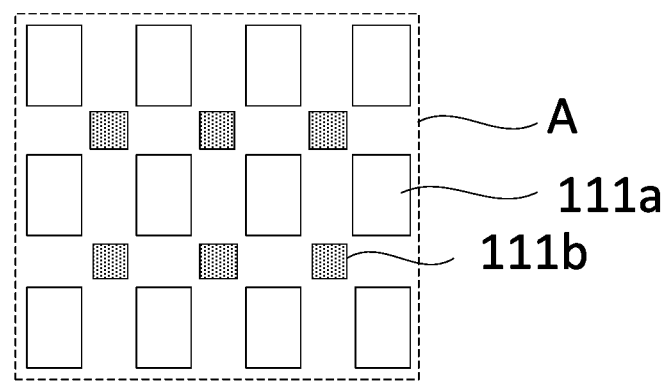
FIGS. 24 and 25 are both enlarged views showing an area A in FIG. 22.
Figure 25:
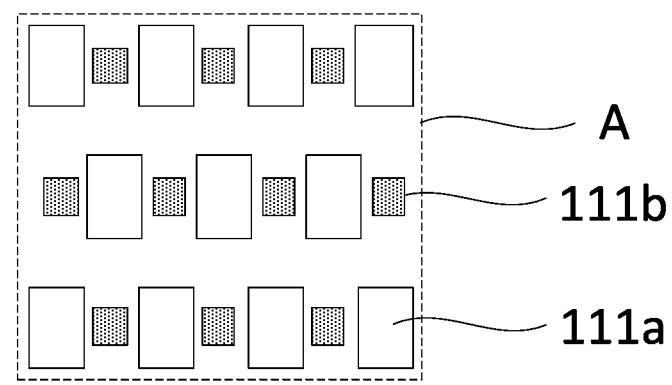

FIGS. 24 and 25 are both enlarged views showing an area A in FIG. 22. As shown in FIGS. 24 and 25, the area A is disposed in the display area 11, the area A includes transparent regions 111a, and transparent regions 111a are arranged in an array, which is shown in FIG. 24. In addition, transparent regions 111a may be staggered in a row direction and a column direction, which is shown in FIG. 25. It should be noted that the arrangement of the transparent regions 111a may be adjusted according to actual needs.

The area A may include pixel regions 111b, as shown in FIG. 24, a pixel region 111b may disposed at a center of an area formed by four adjacent transparent regions 111a. As shown in FIG. 25, a pixel region 111b may disposed between two adjacent transparent regions 111a. For example, the pixel region 111b may disposed between two adjacent transparent regions 111a configured at a same row, or pixel region 111b may disposed between two adjacent transparent regions 111a configured at a same column.

The pixel region 111b includes light-emitting elements, types of the light-emitting elements may include an Organic Light Emitting Diode (OLED) or a Light Emitting Diode (LED). The pixel region 111b may include one light-emitting element, or the pixel region 111b may include multiple light-emitting elements. For example, those light-emitting elements may include red light-emitting elements and green light-emitting elements and blue light-emitting elements, or those light-emitting elements may include light-emitting elements formed by monochromatic light-emitting element and light conversion layers.

The thicknesses of film layers in the transparent regions 111a may include two different kinds of thicknesses, such as d11 and d12 shown in the FIG. 23.

In one embodiment, the thicknesses of film layers in the transparent regions 111a may include more than three different kinds of thicknesses.

The thicknesses of film layers in transparent regions 111a follow a random distribution, for example, when the transparent regions 111a are arranged in an array, thicknesses of film layers in transparent regions 111a follow a random distribution along a row direction, and/or thicknesses of film layers in transparent regions 111a follow a random distribution along a column direction.

The thicknesses of film layers in transparent regions 111a follow a periodic distribution, for example, when the transparent regions 111a are arranged in an array, thicknesses of film layers in transparent regions 111a may be configured to follow a periodic distribution along a row direction and/or a column direction according a first variation cycle, which is shown in FIGS. 3 and 4 in connection with corresponding description. In another implementation mode, the thicknesses of film layers in transparent regions 111a may be configured to follow a periodic distribution along a row direction and/or a column direction according a second variation cycle, which is shown in FIG. 5 in connection with corresponding description.

Figure 26:
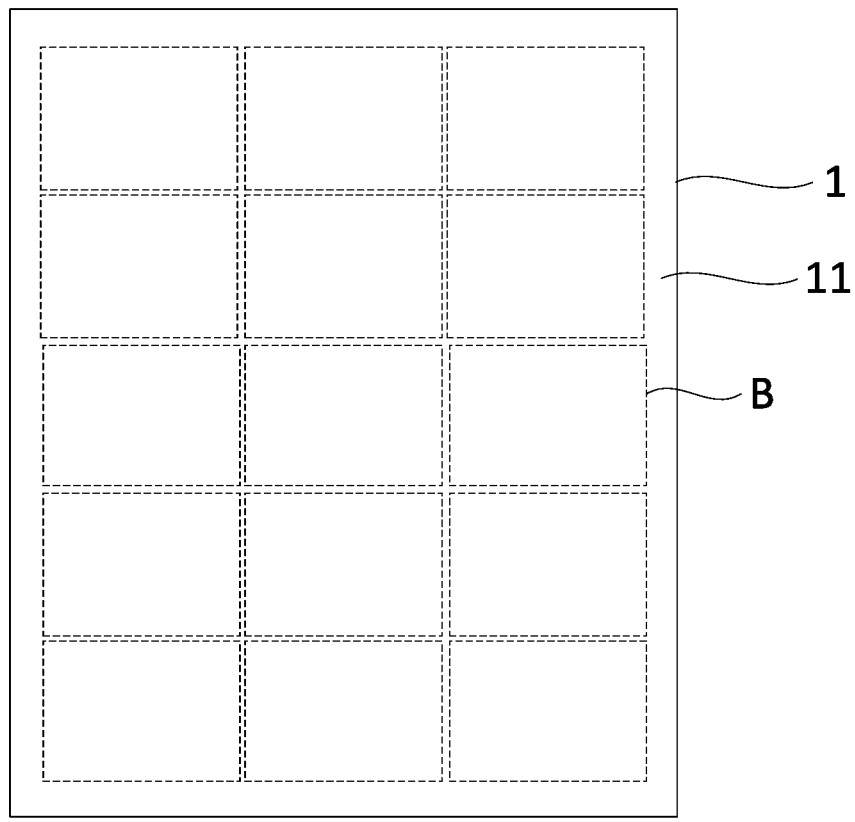
FIG. 26 is a structural diagram of a display panel according to an embodiment of the present disclosure.
Figure 27:
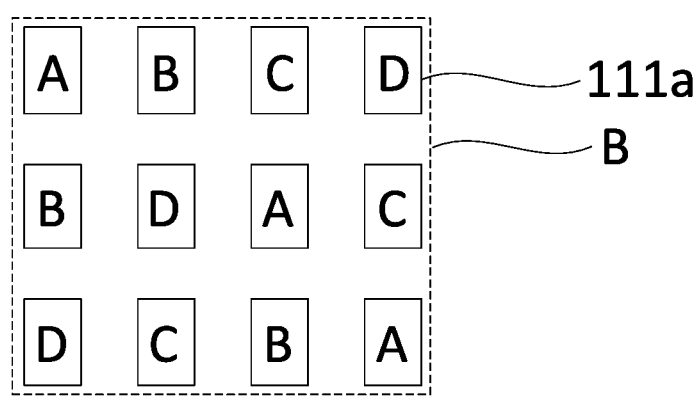
FIG. 27 is an enlarged view showing an area B in FIG. 26.

The thicknesses of film layers in transparent regions 111a may be designed by using a block as a unit. FIG. 26 is a structural diagram of a display panel according to an embodiment of the present disclosure, and FIG. 27 is an enlarged view showing a block in FIG. 26. As shown in FIGS. 26 and 27, the display area 11 may include blocks B, and blocks B are arranged in an array. Each block B includes transparent regions 111a. In FIG. 27, a case in which twelve transparent regions 111a are arranged in three rows and four columns is taken as an example, and the present disclosure does not limit the number of transparent regions 111a included in each block B and the number of transparent regions 111a included in each block B may be configured according to actual requirements. The number of values of thicknesses of film layers in transparent regions 111a included in each block B is less than the total number of the transparent regions 111a included in the each block B. For example, each block B includes a total number of m×n transparent regions 111a that are arranged in m rows and n columns, the thicknesses of film layers in the m×n transparent regions 111a have x values, and x<m×n. As shown in FIG. 27, the thicknesses of film layers in the twelve transparent regions 111a have four values, the four values include thickness A-D, and a rule is applied to the configuration of the four values in the transparent regions 111a in each block B.

Referring to FIG. 26, a same rule may be applied to the thicknesses of film layers in the transparent regions 111a of blocks B, or different rules may be applied to the thicknesses of film layers in the transparent regions 111a of blocks B.

Figure 28:
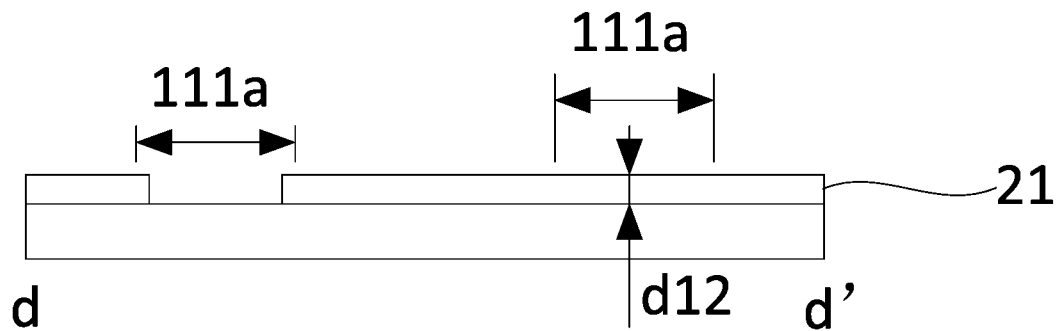
FIGS. 28-38 are sectional views of the display panel taken along a section line d-d' of FIG. 22.

FIG. 28 is a sectional view of the display panel taken along a section line d-d' of FIG. 22. As shown in FIG. 28, the display panel includes a first film layer 21, and the first film layer 21 is configured in at least one transparent region 111a. For example, as shown in FIG. 28, the first film layer 21 is configured in the transparent region 111a at right side, and the first film layer 21 is not configured at least in the other transparent region 111a. That is, as shown in the transparent region 111a at left side in FIG. 28, a portion of the first film layer 21 disposed above the transparent region 111a is removed. In such way, a case that thicknesses of the first film layer 21 in different transparent regions 111a have two kinds of values, which are zero and d12, and d12 is greater than zero.

The first film layer 21 may configured to be an independent pattern disposed in the transparent region 111a, and the first film layer 21 may have a same shape as the transparent region 111a.

Materials of the first film layer 21 may include an organic material and an inorganic material. The organic material may include Polyethylene glycol terephthalate (PET), Polyethylene naphthalate two formic acid glycol ester (PEN), Polycarbonate (PC), Polyimide (PI), vinylsulfonic acid, sodium salt (POLY), Polyformaldehyde (POM) and/or Polyarylate (PAR) and the like. The inorganic material may include Aluminium oxide ($Al_2O_3$), Silicon dioxide ($SiO_x$), Silicon nitride ($SiN_x$), Silicon oxynitride (SiON), Zinc oxide (ZnO), Strontium Oxide (SrO), Titanium Dioxide ($TiO_2$), Hafnium(IV) oxide ($HfO_2$) or Stannic oxide ($SnO_2$) and the like.

The first film layer 21 may be formed by patterning an entire layer, for example, the entire layer is patterned by using etching methods such as a wet etching method or a dry etching method. An inkjet printing method may be applied to from the first film layer 21 having a preset pattern.

Referring to FIG. 28, the first film layer 21 may be a single film layer.

In addition, the first film layer 21 may include multiple film layers, and the multiple film layers are continuously stacked, or the multiple film layers are stacked at an interval. Materials of the multiple film layers forming the first film layer 21 may be same or different. Materials of the multiple film layers forming the first film layer 21 may be inorganic materials or organic materials. Alternatively, materials of the multiple film layers forming the first film layer 21 may include both inorganic materials and organic materials.

Figure 29:
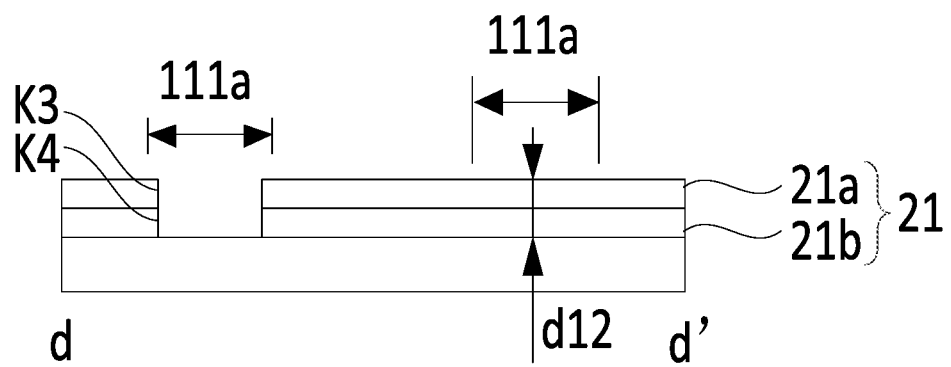

FIG. 29 is another sectional view of the display panel taken along a section line d-d' of FIG. 22. As shown in FIG. 29, the first film layer 21 includes a sub-film layer 21a and a sub-film layer 21b, which are sequentially stacked, and one surface of the sub-film layer 21a in direct contact with one surface of the sub-film layer 21b. An opening K3 is configured in the sub-film layer 21a in the transparent region 111a, an opening K4 is configured in the sub-film layer 21b in the transparent region 111a, and the area of the opening K3 may be equal to the area of the opening K4, which is shown in FIG. 29. Alternatively, the area of the opening K3 may be greater than the area of the opening K4, and the sub-film layer 21b is exposed by the opening K3. Alternatively, the area of the opening K3 may be less than the area of the opening K4, and edges of the opening K4 are covered by the sub-film layer 21a.

Figure 30:
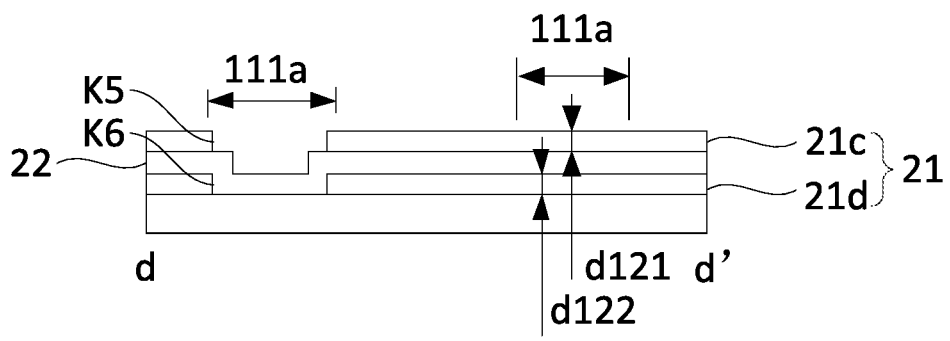

FIG. 30 is another sectional view of the display panel taken along a section line d-d' of FIG. 22. As shown in FIG. 30, the first film layer 21 includes a sub-film layer 21c and a sub-film layer 21d, which are sequentially stacked. Along a direction in which the sub-film layer 21c and the sub-film layer 21d are sequentially stacked, an intermediate layer 22 is disposed between the sub-film layer 21c and the sub-film layer 21d, and the intermediate layer 22 is configured to be continuous over the positions where openings (e.g. K5 and K6) are configured in the sub-film layer 21c and the sub-film layer 21d. The values of thicknesses of film layers of first film layer 21 in different transparent regions 111a may include 0 (e.g. transparent region 111a at left side) and (d121+d122) (e.g. transparent region 111a at right side), where d121 denotes the thickness of the sub-film layer 21c and d122 denotes the thickness of the sub-film layer 21d. An opening K5 is configured in the sub-film layer 21c in the transparent region 111a, an opening K6 is configured in the sub-film layer 21d in the transparent region 111a, and the area of the opening K5 may be equal to the area of the opening K6. Alternatively, the area of the opening K5 may be greater than the area of the opening K6. Alternatively, the area of the opening K5 may be less than the area of the opening K6.

When the number of sub-film layers included in the first film layer 21 is greater than or equal to 3, the configuration shown in FIGS. 29 and 30 may be applied to the configuration of sub-film layers included in the first film layer 21 for reference, or the configuration of sub-film layers included in the first film layer 21 may adopt the combination of configurations shown in FIGS. 29 and 30.

In addition, the display panel 1 may include a second film layer.

Figure 31:
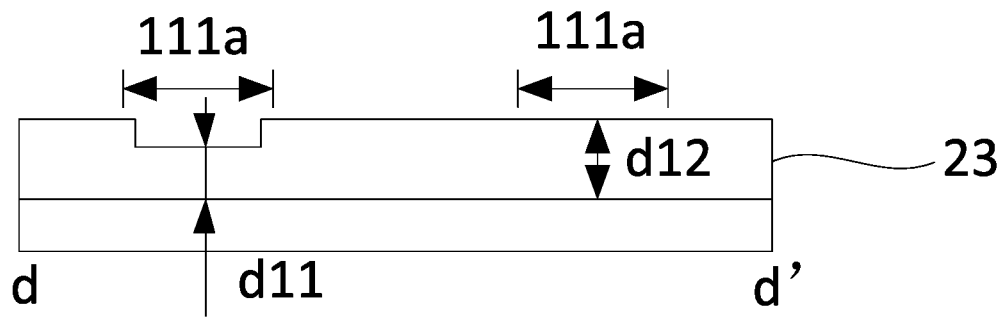

FIG. 31 is another sectional view of the display panel taken along a section line d-d' of FIG. 22. As shown in FIG. 31, the display panel 1 includes a second film layer 23, and the second film layer 23 has different thicknesses in at least two transparent regions 111a. By taking two transparent regions 111a shown in FIG. 31 as an example, a thickness d11 of a portion of the second film layer 23 in the transparent region 111a at the left side is less than a thickness d12 of a portion of the second film layer 23 in the transparent region 111a at the right side.

Figure 32:
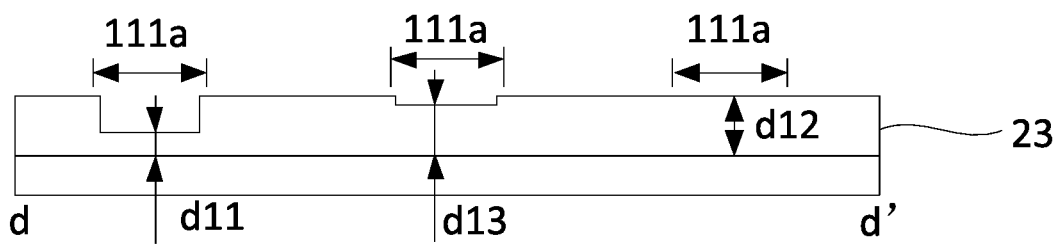

FIG. 32 is another sectional view of the display panel taken along a section line d-d' of FIG. 22. As shown in FIG. 32, the second film layer 23 has different thicknesses in at least three transparent regions 111a. By taking three transparent regions 111a shown in FIG. 32 as an example, a thickness d11 of a portion of the second film layer 23 in the transparent region 111a at the left side is less than a thickness d13 of a portion of the second film layer 23 in the transparent region 111a at the center, and the thickness d13 of a portion of the second film layer 23 in the transparent region 111a at the center is less than a thickness d12 of a portion of the second film layer 23 in the transparent region 111a at the right side.

Materials of the second film layer 23 may include an organic material and an inorganic material. The organic material may include Polyethylene glycol terephthalate (PET), Polyethylene naphthalate two formic acid glycol ester (PEN), Polycarbonate (PC), Polyimide (PI), vinylsulfonic acid, sodium salt (POLY), Polyformaldehyde (POM) and/or Polyarylate (PAR) and the like. The inorganic material may include Aluminium oxide ($Al_2O_3$), Silicon dioxide ($SiO_x$), Silicon nitride ($SiN_x$), Silicon oxynitride (SiON), Zinc oxide (ZnO), Strontium Oxide (SrO), Titanium Dioxide ($TiO_2$), Hafnium(IV) oxide ($HfO_2$) or Stannic oxide ($SnO_2$) and the like.

The second film layer 23 may be formed by patterning an entire layer by using halftone mask method.

Referring to FIGS. 31 and 32, the second film layer 23 may be a single film layer.

In addition, the second film layer 23 may include multiple film layers, and a thickness of each film layer in the multiple film layers in at least one transparent region 111a is less than a thickness of each film layer in the multiple film layers in the other transparent region 111a. Two adjacent film layers in the multiple film layers are directly in contact with each other, or an intermediate layer may be configured between the two adjacent film layers so that the two adjacent film layers are disposed at an interval.

Figure 33:
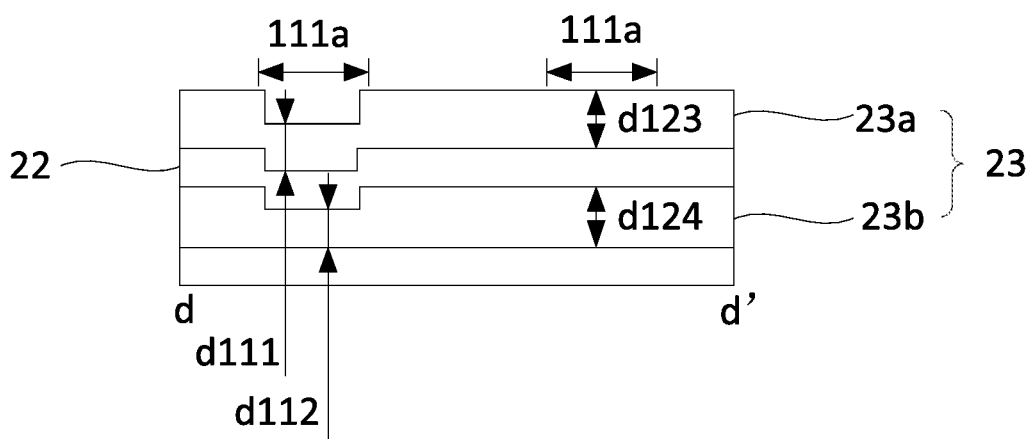

FIG. 33 is another sectional view of the display panel taken along a section line d-d' of FIG. 22. As shown in FIG. 33, the second film layer 23 includes a sub-film layer 23a and a sub-film layer 23b, and the sub-film layer 23a and the sub-film layer 23b are disposed at an interval by configuring the an intermediate layer 22 between the sub-film layer 23a and the sub-film layer 23b. The thickness d111 of the sub-film layer 23a in transparent region 111a at left side is less than the thickness d123 of the sub-film layer 23a in transparent region 111a at right side. The thickness d112 of the sub-film layer 23b in transparent region 111a at left side is less than the thickness d124 of the sub-film layer 23b in transparent region 111a at right side.

As shown in FIGS. 31-33, the portions of the second film layer 23 having different thicknesses are continuously configured, that is, the second film layer 23 extends from one transparent region 111a to another transparent region 111a.

Figure 34:
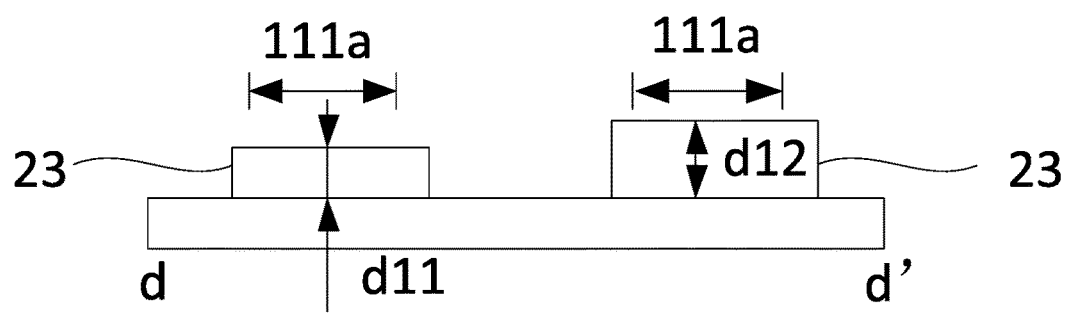

FIG. 34 is another sectional view of the display panel taken along a section line d-d' of FIG. 22. As shown in FIG. 34, the second film layer 23 having different thicknesses is not continuously configured between two adjacent transparent regions 111a, the second film layer 23 may include an independent pattern disposed in the transparent region 111a, and the second film layer 23 may have an approximate outline or a same outline as the transparent region 111a. For example, when the transparent region 111a has a rectangular shape, the pattern of the second film layer 23 in the transparent region 111a also has a rectangular shape.

Figure 35:
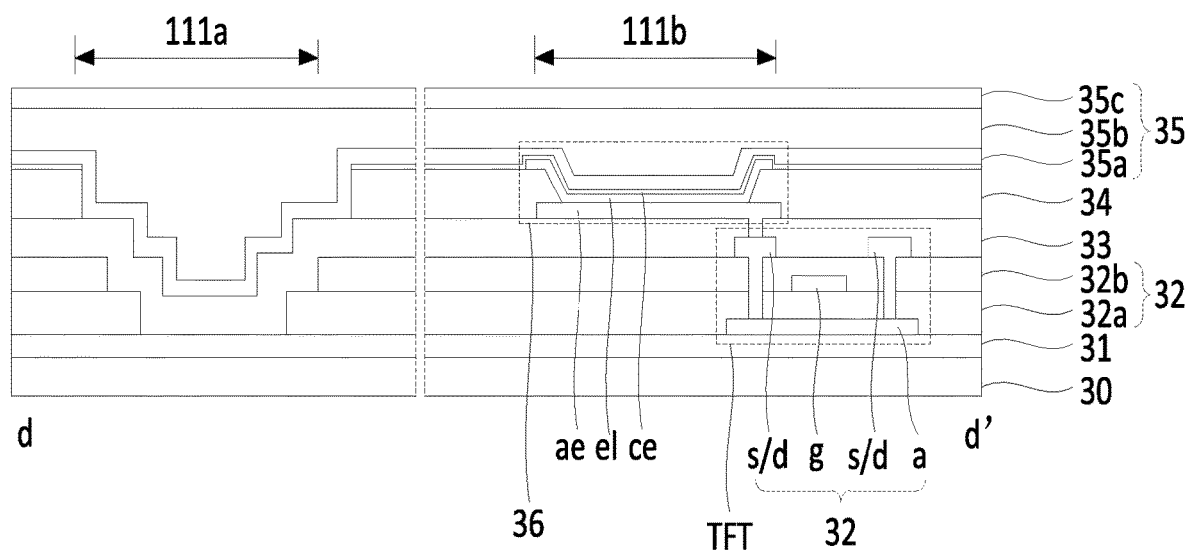
Figure 36:
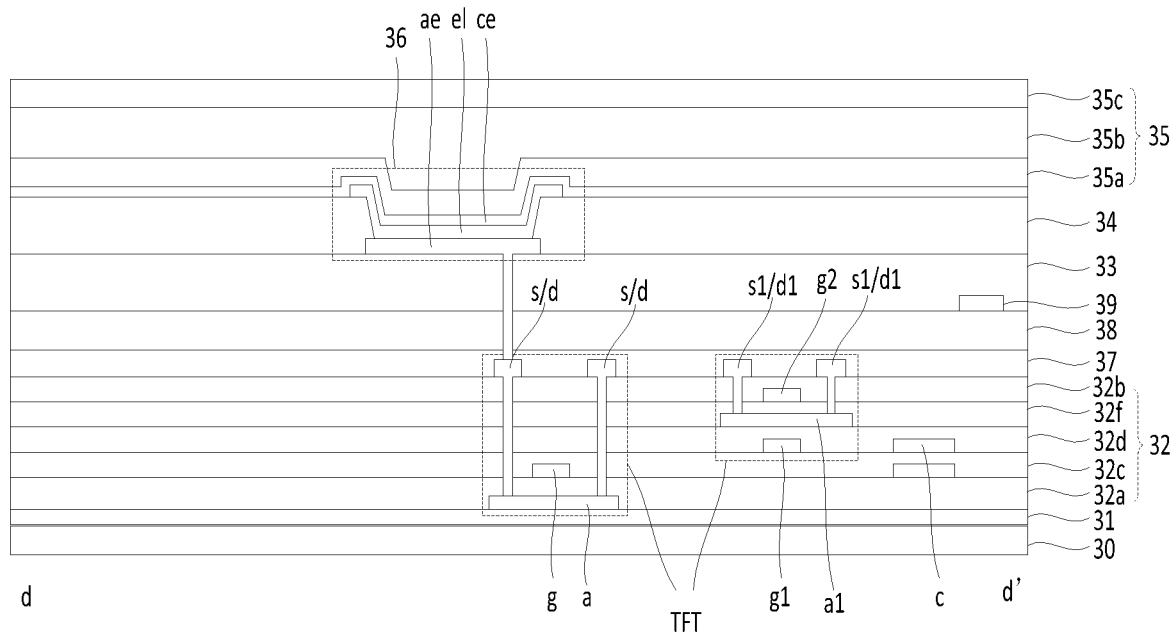

FIGS. 35 and 36 are sectional views of the display panel taken along a section line d-d' of FIG. 22. As shown in the FIGS. 35 and 36, the display panel 1 includes a base substrate 30, a buffer layer 31, an array layer 32, a planarization layer 33, a pixel defining layer 34, a thin-film encapsulation layer 35 and light emitting elements 36.

Materials of the base substrate 30 include glass and organic materials. When the materials of the base substrate 30 are organic materials, the base substrate 30 may include three stacked film layers. For example, the base substrate 30 includes one Polyimide (PI) layer, one Silicon dioxide layer and one PI layer in turn.

The buffer layer 31 is disposed on one side of the base substrate 30, and a material of buffer layer 31 includes an inorganic material.

The array layer 32 is disposed on one side of the buffer layer 31 facing away from the base substrate 30, the array layer 32 includes an active layer a, a gate insulation layer 32a, a gate g, an interlayer insulation layer 32b and source/drain s/d. A film layer in which the gate g is disposed is configured between a film layer in which the active layer a is disposed and a film layer in which the source/drain s/d is disposed. A film layer in which the gate insulation layer 32a is disposed is configured between a film layer in which the active layer a is disposed and a film layer in which the gate g is disposed. A film layer in which the interlayer insulation layer 32b is disposed is configured between a film layer in which the gate g is disposed and a film layer in which the source/drain s/d is disposed. Film layers in the array layer 32 form Thin Film Transistors (TTFs), and the TFT is used to form a pixel circuit for driving the light emitting element 36. The materials of the gate insulation layer 32a and the interlayer insulation layer 32b include inorganic materials.

The planarization layer 33 is disposed on one side of the array layer 32 facing away from the base substrate 30, and the material of the planarization layer 33 includes an organic material.

The pixel defining layer 34 is disposed on one side of the planarization layer 33 facing away from the base substrate 30, the pixel defining layer 34 includes an opening, and the opening is used for limiting a configuration area of the light emitting element 36. A material of the pixel defining layer 34 may include an organic material, and the material of the pixel defining layer 34 may also include light-absorbing material, so that the light may not pass through the pixel defining layer 34.

The light emitting element 36 may be an Organic Light Emitting Diode (OLED), and the light emitting element 36 may include an anode ae, a cathode ce and a light-emitting material layer el disposed between the anode ae and the cathode ce.

The thin-film encapsulation layer 35 is disposed on one side of the light emitting element 36 facing away from the base substrate 30, and the light emitting element 36 and the pixel defining layer 34 are covered by the thin-film encapsulation layer 35. The thin-film encapsulation layer 35 may include a first encapsulation inorganic layer 35a, an encapsulation organic layer 35b and a second encapsulation inorganic layer 35c.

At least one of the base substrate 30, the buffer layer 31, the array layer 32, the planarization layer 33 and the pixel defining layer 34 in the at least two transparent regions 111a has different thicknesses, and/or at least one of the base substrate 30, the buffer layer 31, the array layer 32, the planarization layer 33 and the pixel defining layer 34 in the at least two transparent regions 111a is made of different materials.

Referring to FIG. 35, at least one of the base substrate 30, the buffer layer 31, the array layer 32, a planarization layer 33 and a pixel defining layer 34 included in the display panel 1 may be the first film layer 21 or the second film layer 23 shown in FIGS. 22-34, and the intermediate layer 22 shown in FIGS. 22-34 may selected as above-mentioned layers.

As shown in FIG. 35, the display region 11 of the display panel 1 includes transparent regions 111a and pixel regions 111b, and the light emitting elements 36 are configured in the pixel region 111b. In the transparent region 111a, the gate insulation layer 32a and the interlayer insulation layer 32b included in the array layer 32 are removed, and then the pixel defining layer 34 is removed. An area of removed portions of each film layer may be the same or different. By taking the FIG. 36 as an example, an area of an opening of the interlayer insulation layer 32b formed in the transparent region 111a is greater than an area of an opening of the gate insulation layer 32a formed in the transparent region 111a, and an area of an opening of the pixel defining layer 34 formed in the transparent region 111a is greater than an area of an opening of the interlayer insulation layer 32b formed in the transparent region 111a. The transparent regions 111a and the pixel regions 111b are covered by the thin-film encapsulation layer 35.

It should be noted that FIG. 35 illustrates the configurations of film layers of the display panel in the transparent regions 111a and the pixel regions 111b.

The display panel 1 further includes a light-shielding layer, and the light-shielding layer is used for limiting the transparent region 111a. The light-shielding layer may include the pixel defining layer 34 of black materials and a metal light-shielding layer disposed on the base substrate 30.

As shown in FIG. 36, the display panel further includes a first buffer layer 37, an auxiliary planarization layer 38 and a third metal layer 39. In addition, the array layer 32 includes an active layer a, a gate insulation layer 32a, a gate g, a capacitive metal layer c, a first interlayer insulation layer 32c, a first gate insulation layer 32d, an oxide semiconductor active layer a1, a second gate insulation layer 32f, a second gate g2 and interlayer insulation layer 32b. A first gate g1 forming an Oxide thin film transistor and the capacitive metal layer c are disposed in a same layer.

In the array layer 32, the material of each insulation layer may include an inorganic layer.

The first buffer layer 37 is disposed on one side of the array layer 32 facing away from the base substrate 30, and a material of the first buffer layer 37 includes an inorganic material.

The auxiliary planarization layer 38 is disposed on one side of the first buffer layer 37 facing away from the base substrate 30, and a material of the auxiliary planarization layer 38 includes an organic material.

The third metal layer 39 is disposed on one side of the auxiliary planarization layer 38 facing away from the base substrate 30.

The planarization layer 33 is dispose on one side of the third metal layer 39 facing away from the base substrate 30.

Referring to FIG. 36, at least one of the base substrate 30, the buffer layer 31, the array layer 32, the first buffer layer 37, the auxiliary planarization layer 38, a planarization layer 33 and a pixel defining layer 34 included in the display panel 1 may be the first film layer 21 or the second film layer 23 shown in FIGS. 22-34, and the intermediate layer 22 shown in FIGS. 22-34 may selected as above-mentioned layers.

Figure 37:
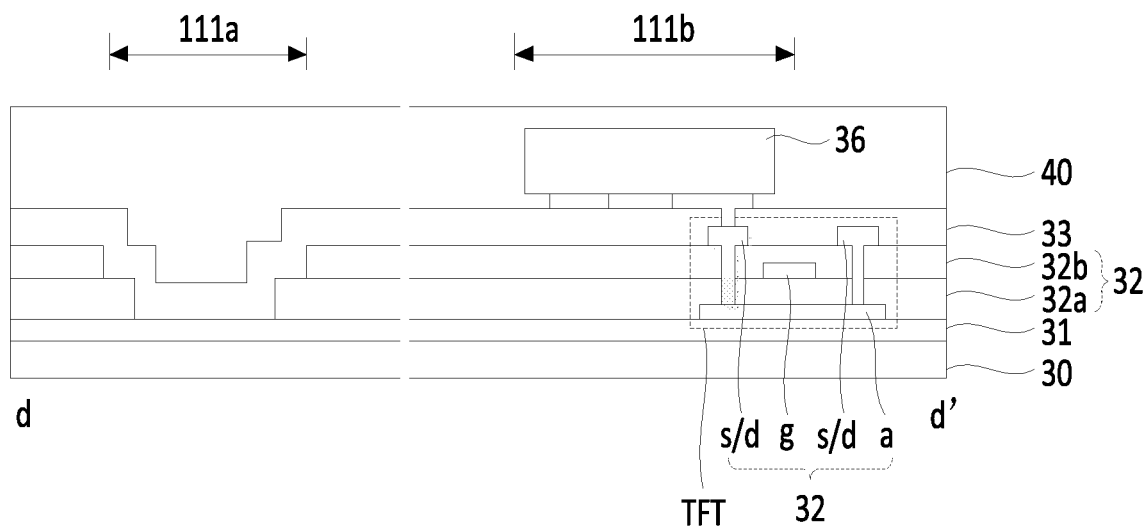

FIG. 37 is another sectional view of the display panel taken along a section line d-d' of FIG. 22. As shown in FIG. 37, the display panel 1 includes a base substrate 30, a buffer layer 31, an array layer 32, a planarization layer 33, light-emitting elements 36 and an encapsulation layer 40.

Materials of the base substrate 30 includes glass and organic materials. When the materials of the base substrate 30 include organic materials, the base substrate 30 may include three stacked film layers. For example, the base substrate 30 includes one Polyimide (PI) layer, one Silicon dioxide layer and one PI layer in turn.

The buffer layer 31 is disposed on one side of the base substrate 30, and a material of buffer layer 31 includes an inorganic material.

The array layer 32 is disposed on one side of the buffer layer 31 facing away from the base substrate 30, the array layer 32 includes an active layer a, a gate insulation layer 32a, a gate g, an interlayer insulation layer 32b and source/drain s/d. A film layer in which the gate g is disposed is configured between a film layer in which the active layer a is disposed and a film layer in which the source/drain s/d is disposed. A film layer in which the gate insulation layer 32a is disposed is configured between a film layer in which the active layer a is disposed and a film layer in which the gate g is disposed. A film layer in which the interlayer insulation layer 32b is disposed is configured between a film layer in which the gate g is disposed and a film layer in which the source/drain s/d is disposed. Film layers in the array layer 32 form Thin Film Transistors (TTFs), and the TFT is used to form a pixel circuit for driving the light emitting element 36. The materials of the gate insulation layer 32a and the interlayer insulation layer 32b include inorganic materials.

The planarization layer 33 is disposed on one side of the array layer 32 facing away from the base substrate 30, and the material of the planarization layer 33 includes an organic material.

The light emitting element 36 may be an inorganic light emitting diode, and the light emitting elements may include N-type semiconductor layer, P-type semiconductor layer and a Quantum well layer disposed between the N-type semiconductor layer and the P-type semiconductor layer.

The encapsulation layer 40 is disposed on one side of the light-emitting element 36 facing away from the base substrate 30, the light-emitting element 36 is covered by the encapsulation layer 40, and the encapsulation layer 40 is disposed in the transparent region 111a.

As shown in FIG. 37, the display region 11 of the display panel 1 includes transparent regions 111a and pixel regions 111b, and the light emitting elements 36 are configured in the pixel region 111b. In the transparent region 111a, the gate insulation layer 32a and the interlayer insulation layer 32b included in the array layer 32 are removed. An area of removed portions of each film layer may be the same or different. By taking the FIG. 37 as an example, an area of an opening of the interlayer insulation layer 32b formed in the transparent region 111a is greater than an area of an opening of the gate insulation layer 32a formed in the transparent region 111a.

The display panel 1 includes a display area 11, the display area 11 includes transparent regions 111a, and film layers in at least two transparent regions 111a are made of different materials.

In a case where the film layers in the transparent regions 111a are made of different materials, the film layers in the transparent regions 111a may have a same thickness or different thicknesses.

For two transparent regions 111a made of different materials, one of the two transparent regions 111a includes a first material, and the other of the two transparent regions 111a includes a second material. The configurations of the first material and the second material may include the following cases. In case one, one of the first material and the second material is an organic material, and the other of the first material and the second material is an inorganic material. In case two, the first material and the second material are both inorganic materials, and the first material is different from the second material. In case three, the first material and the second material are both organic materials, and the first material is different from the second material. The film layer formed by using the first material and the film layer formed by using the second material have different effects on the optical path of light.

Alternatively, for two transparent regions made of different materials, the thickness ratio of film layers made of at least two materials in one of the two transparent regions is different from that of film layers made of at least two materials in the other of the two transparent regions.

Figure 38:
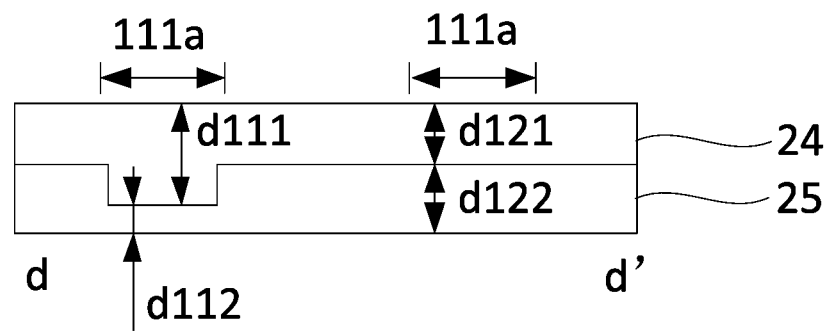

FIG. 38 is another sectional view of the display panel taken along a section line d-d' of FIG. 22. As shown in FIG. 38, the display panel 1 includes a third film layer 24 and a fourth film layer 25, and the third film layer 24 adopts a first material and the fourth film layer 25 adopts a second material. The configuration of the first material and the second material may refer to above-mentioned contents. The thickness ratio of third film layer 24 and the fourth film layer 25 in the transparent region 111a at left side of FIG. 38 is d111/d112, and the thickness ratio of third film layer 24 and the fourth film layer 25 in the transparent region 111a at right side of FIG. 38 is d121/d122.

At least one transparent region includes transparent sub-regions, film layers in each transparent sub-region in a same transparent region have different thicknesses, and/or the film layers in each transparent sub-region in a same transparent region are made of different materials.

FIGS. 39A-39D are diagrams showing transparent regions of the display panel according to an embodiment of the present disclosure, and FIGS. 39A-39D illustrate four kinds of configurations of transparent regions. As shown in FIGS. 39A-39D, the transparent region 111a includes plurality of transparent sub-regions sa, film layers in each transparent sub-region sa in a same transparent region 111a have different thicknesses, and/or the film layers in each transparent sub-region sa in a same transparent region 111a are made of different materials. The configuration related to film layers of different thicknesses or different materials may refer to aforementioned related content.

FIGS. 39A-39D illustrate four distribution manners of each transparent sub-region in the transparent region 111a, for each configuration manner, a top view and a corresponding sectional view are provided in the drawings.

Figure 39A:
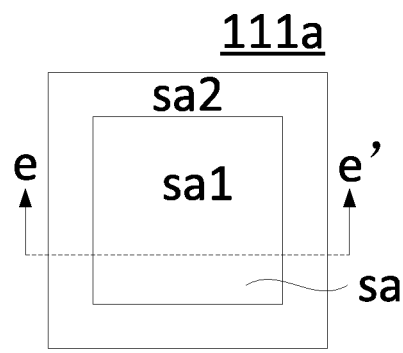
FIGS. 39A-41 are diagrams showing transparent regions of the display panel according to an embodiment of the present disclosure.
Figure 39A:
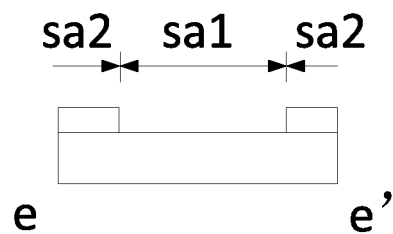

In a case shown in FIG. 39A, each transparent sub-region sa in the transparent region 111a includes a first transparent sub-region sa1 and a second transparent sub-region sa2, and the second transparent sub-region sa2 surrounds the first transparent sub-region sa1. In the sectional view shown in FIG. 39A, a case in which the thickness of film layer in the second transparent sub-region sa2 is greater than that in the first transparent sub-region sa1 is taken as an example. In other implementation modes the thickness of film layer in the second transparent sub-region sa2 may be less than that in the first transparent sub-region sa1.

Still referring to FIG. 39A, a part of film layers in the second transparent sub-region sa2 keeps flush at the edge positions adjacent to the first transparent sub-region sa1. In other implementation modes, the thicknesses of film layers in the second transparent sub-region sa2 are gradually varied along a direction pointing from the second transparent sub-region sa2 to the first transparent sub-region sa1. For example, at least two film layers configured in the second transparent sub-region sa2 is removed from the first transparent sub-region sa1, so that a trapezoid may be formed at edge positions of the film layers in the transparent sub-region sa2 adjacent to the first transparent sub-region sa1.

Figure 39B:
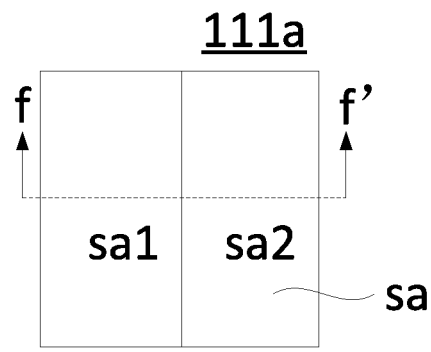
Figure 39B:
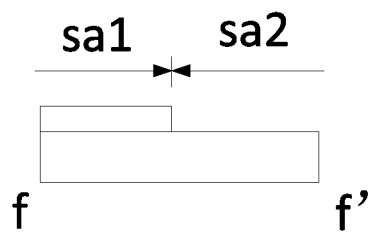

In a case shown in FIG. 39B, transparent sub-regions sa in the transparent region 111a include a first transparent sub-region sa1 and a second transparent sub-region sa2. The first transparent sub-region sa1 and the second transparent sub-region sa2 are arranged in a direction, and the film layer in the first transparent sub-region sa1 has a different thickness with the film layer in the second transparent sub-region sa2.

Figure 39C:
Figure 39C:
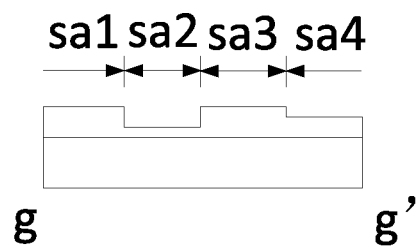
Figure 39D:
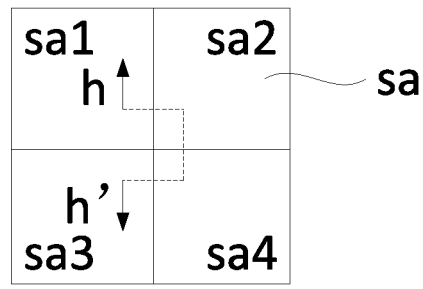
Figure 39D:
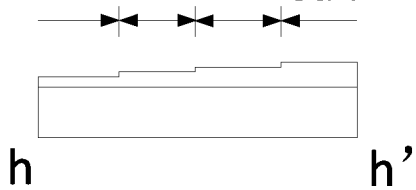

In cases shown in FIGS. 39C and 39D, the number of the transparent sub-regions in the transparent region 111a is greater than two. Taking four transparent sub-regions (e.g. sa1-sa4) as an example, in the case shown in FIG. 39C, the four transparent sub-regions sa1-sa4 are sequentially arranged along a direction. Along an arranging direction of the four transparent sub-regions sa1-sa4, thicknesses of film layers in the four transparent sub-regions sa1-sa4 may be randomly configured, sequentially increased, or configured in a manner in which a larger thickness and a smaller thickness are alternatively arranged. In the case shown in FIG. 39D, the four transparent sub-regions sa1-sa4 are arranged in a form of a rectangular shape along two directions that cross each other. Along the section line h-h', thicknesses of film layers in the four transparent sub-regions sa1-sa4 may be randomly configured, sequentially increased, or configured in a manner in which a larger thickness and a smaller thickness are alternatively arranged.

Figure 40A:
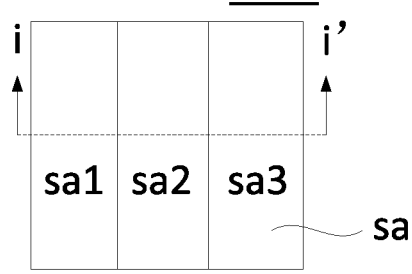
Figure 40A:
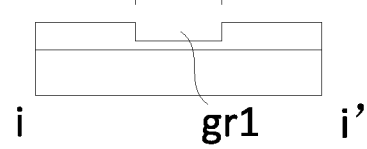
Figure 40B:
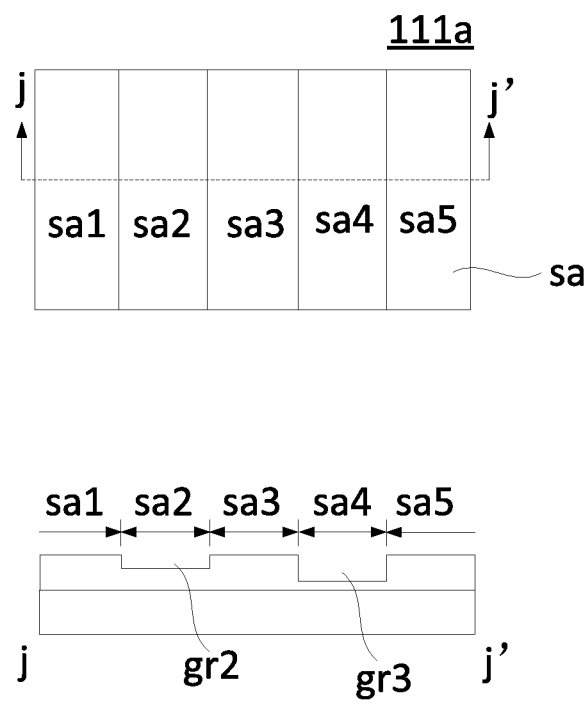

FIGS. 40A and 40B illustrate two distribution manners of the transparent sub-regions in the transparent region 111a. For each configuration manner, a top view and a corresponding sectional view are provided in the drawings. As shown in FIGS. 40A and 40B, grooves are configured in film layers in the transparent region 111a, so that film layers including portions having different thicknesses may be formed in a single transparent region 111a. In a case shown in FIG. 40A, the transparent region 111a includes three transparent sub-regions sa1-sa3, and a groove gr1 is configured in a film layer corresponding to the second transparent sub-region sa2. In a case shown in FIG. 40B, the transparent region 111a includes five transparent sub-regions sa1-sa5, and the five transparent sub-regions sa1-sa5 are sequentially arranged along a direction. A groove gr2 is configured in a film layer corresponding to the second transparent sub-region sa2, a groove gr3 is configured in a film layer corresponding to the fourth transparent sub-region sa4, and a depth of the groove gr2 and a depth of the groove gr3 are the same or different. An extension direction of the grooves intersect with an arranging direction of each transparent sub-region. In other implementations, multiple grooves configured in a same transparent region 111a may be intersect with each other, or multiple grooves configured in a same transparent region 111a may be arranged in an array.

In aforementioned contents, a case in which the transparent region 111a is configured to a rectangular shape is taken as an example, the shape of the transparent region 111a may include a regular polygon (e.g. quadrilateral and pentagon), an ellipse, a circle, a cruciform, an irregular shape and the like.

Figure 41:
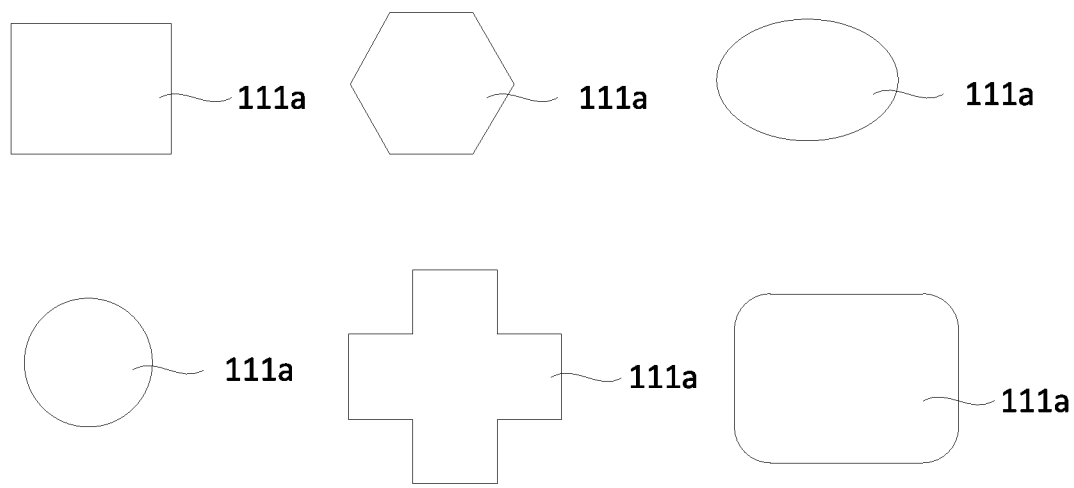

FIG. 41 is a diagram showing shapes of transparent regions according to an embodiment of the present disclosure. Exemplarily, the shapes of the transparent region 111a include the following shapes: a rectangle, a hexagon, an ellipse, a circle, a cruciform and a rounded rectangle.

The edges of the transparent region 111a may include straight segments, for example, edges may include each side of the rectangle and the hexagon shown in FIG. 41. The edges of the transparent region 111a may include curves, for example, edges may include the ellipse, the circle and the rounded rectangle. The edges of the transparent region 111a may be designed as a wave shape, so that the diffraction problem easily occurred in the transparent region 111a may be improved.

Figure 42:
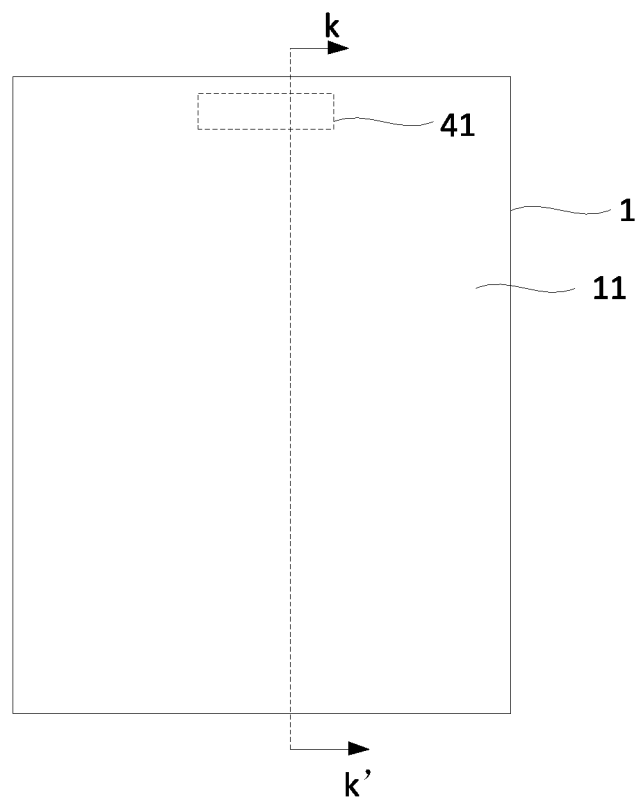
FIG. 42 is a structural diagram of a display panel according to an embodiment of the present disclosure.
Figure 43:
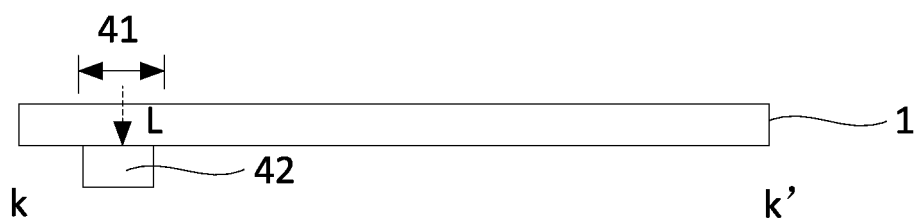
FIG. 43 is a sectional view of the display panel taken along a section line k-k' of FIG. 42.

FIG. 42 is a structural diagram of a display panel according to an embodiment of the present disclosure, and FIG. 43 is a sectional view of the display panel taken along a section line k-k' of FIG. 42. As shown in FIGS. 42 and 43, the display panel 1 includes a display area 11, the display area 11 includes an optical component setting area 41, and the transparent region 111a may be configured in the optical component setting area 41. An optical element 42 may configured at the back of the display panel 1, the position of the optical element 42 may be corresponded to the optical component setting area 41 in the display panel 1. The optical element 42 may include a camera, a fingerprint recognition module, an infrared rangefinder and the like. When the optical element 42 in an operating mode, the light L may pass through the transparent region 111a and then reach the optical element 42.

Figure 44:
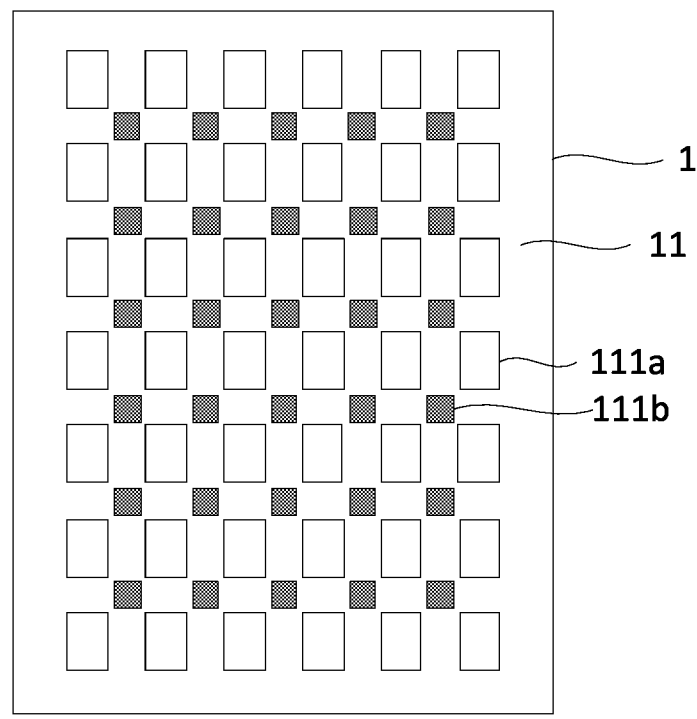
FIG. 44 is a structural diagram of a display panel according to an embodiment of the present disclosure.

FIG. 44 is a structural diagram of a display panel according to an embodiment of the present disclosure. As shown in FIG. 44, the display panel 1 may be a transparent display panel, and the display panel 1 includes a display area 11, transparent regions 111a are evenly distributed in the display area 11, and pixel regions 111b may be also evenly distributed in the display area 11. This display panel 1 may be applied to image display and allow the user to view the object at the back of the display panel.

Embodiments of present disclosure further provide a display device, and the display device may include a display panel according to one of above embodiments. For example, display device includes devices having a display function, such as a mobile terminal (e.g. mobile phone), a computer, a vehicular screen and a window display screen.

Figure 45:
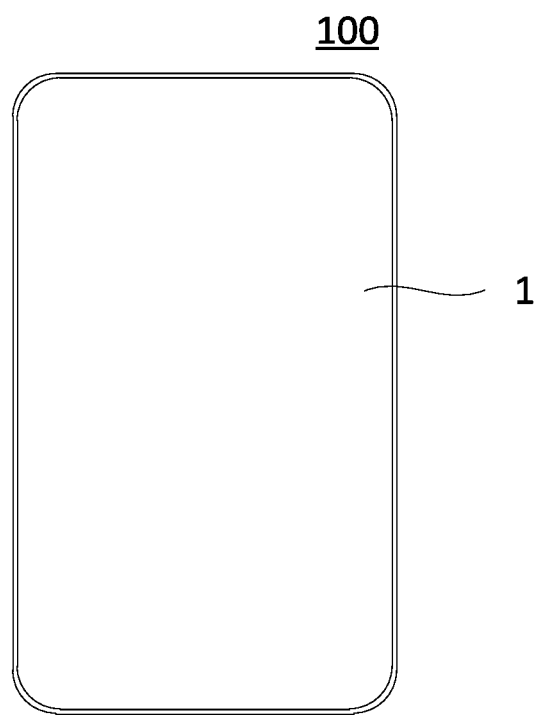
FIG. 45 is a structural diagram of a display device according to an embodiment of the present disclosure.

FIG. 45 is a structural diagram of a display device according to an embodiment of the present disclosure. As shown in FIG. 45, a mobile phone is taken as an example, the display device 100 includes the display panel 1 described in aforementioned contents.

What is claimed is:
1. A display panel, comprising:
a display area, wherein the display area comprises a plurality of transparent regions, wherein film layers in at least two transparent regions in the plurality of transparent regions have different thicknesses, or the film layers in the at least two transparent regions in the plurality of transparent regions are made of different materials,
wherein the display panel further comprises: a first film layer, wherein the film layers in the at least two transparent regions having different thicknesses comprises the film layers in a first transparent region of the at least two adjacent transparent regions comprising the first film layer, and the film layers in a second transparent region of the at least two adjacent transparent regions not comprising the first film layer.

2. The display panel of claim 1, wherein the film layers in the at least two adjacent transparent regions in the plurality of transparent regions have different thicknesses, or the film layers in the at least two adjacent transparent regions in the plurality of transparent regions are made of different materials.

3. The display panel of claim 1, wherein the first film layer comprises a single film layer.

4. The display panel of claim 1, wherein the first film layer comprises multiple film layers, wherein the multiple film layers are continuously stacked, or the multiple film layers are stacked at an interval.

5. The display panel of claim 1, wherein the film layers in the at least two transparent regions in the plurality of transparent regions making of different materials comprises: for two transparent regions making of different materials, a material of the film layers in one of the two transparent regions comprises an organic material, and a material of the film layers in the other of the two transparent regions comprises an inorganic material; or for two transparent regions making of different materials, the two film layers in the two transparent regions being made of different materials, a thickness ratio of the two film layers in one of the two transparent regions being different from a thickness ratio of the two film layers in the other of the two transparent regions.

6. The display panel of claim 1, wherein at least one transparent region in the plurality of transparent regions comprises a plurality of transparent sub-regions, the film layers in each transparent sub-region in a same transparent region have different thicknesses, or the film layers in each transparent sub-region in a same transparent region are made of different materials.

7. The display panel of claim 6, wherein a same transparent region comprises a first transparent sub-region and a second transparent sub-region, wherein the first transparent sub-region is surrounded by the second transparent sub-region.

8. The display panel of claim 7, wherein a thickness of film layer disposed in the second transparent sub-region is greater than a thickness of the film layer disposed in the first transparent sub-region.

9. The display panel of claim 8, wherein along a direction pointing from the second transparent sub-region to the first transparent sub-region, a thickness of the film layer disposed in the second transparent sub-region is gradually varied.

10. The display panel of claim 6, wherein grooves are configured in the film layers in the plurality of transparent regions.

11. The display panel of claim 1, wherein edges in the plurality of transparent regions comprise curves.

12. The display panel of claim 1, wherein the thicknesses of the film layers in the plurality of transparent regions follow a random distribution.

13. The display panel of claim 1, wherein the thicknesses of the film layers in the plurality of transparent regions follow a periodic distribution.

14. A display device, comprising the display panel of claim 1.

15. A display panel, comprising:
a display area, wherein the display area comprises a plurality of transparent regions, wherein film layers in at least two transparent regions in the plurality of transparent regions have different thicknesses, or the film layers in the at least two transparent regions in the plurality of transparent regions are made of different materials;
wherein the display panel further comprises: a second film layer, second film layers in the at least two transparent regions having different thicknesses.

16. The display panel of claim 15, wherein along a film laying direction, the second film layer continuously extends from a first transparent region of the at least two transparent regions to a second transparent region of the at least two transparent regions, or the second film layer being not continuously configured between two adjacent transparent regions.

17. A display panel, comprising:
a display area, wherein the display area comprises a plurality of transparent regions, wherein film layers in at least two transparent regions in the plurality of transparent regions have different thicknesses, or the film layers in the at least two transparent regions in the plurality of transparent regions are made of different materials;
a base substrate;
a buffer layer disposed on one side of the base substrate;
an array layer disposed on one side of the buffer layer facing away from the base substrate; and
a planarization layer disposed on one side of the array layer facing away from the base substrate;
wherein at least one of the base substrate, the buffer layer, the array layer and the planarization layer in the at least two transparent regions has different thicknesses, or at least one of the base substrate, the buffer layer, the array layer and the planarization layer in the at least two transparent regions is made of different materials.

18. The display panel of claim 17, further comprising:
a pixel defining layer, which is disposed on one side of the planarization layer facing away from the base substrate;
wherein at least one of the base substrate, the buffer layer, the array layer, the planarization layer and the pixel defining layer in the at least two transparent regions has different thicknesses, or at least one of the base substrate, the buffer layer, the array layer, the planarization layer and the pixel defining layer in the at least two transparent regions is made of different materials.

* * * * *